United States Patent
Ide

(10) Patent No.: US 7,683,676 B2
(45) Date of Patent: Mar. 23, 2010

(54) SIGNAL-LEVEL DETECTING APPARATUS, OPTICAL RECEIVER, AND SIGNAL-LEVEL DETECTING METHOD

(75) Inventor: Satoshi Ide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 249 days.

(21) Appl. No.: 11/585,277

(22) Filed: Oct. 24, 2006

(65) Prior Publication Data

US 2008/0042735 A1 Feb. 21, 2008

(30) Foreign Application Priority Data

Jun. 14, 2006 (JP) ............................. 2006-165234

(51) Int. Cl.
*H03K 5/153* (2006.01)
(52) U.S. Cl. ............................. 327/58; 327/62; 327/427
(58) Field of Classification Search ............. 327/58–62, 327/427, 434, 538, 541, 543
See application file for complete search history.

(56) References Cited

U.S. PATENT DOCUMENTS

| | | | | |
|---|---|---|---|---|
| 5,391,979 A | * | 2/1995 | Kajimoto et al. | ............ 323/313 |
| 5,883,798 A | * | 3/1999 | Yamaguchi | .................. 323/316 |
| 5,923,219 A | * | 7/1999 | Ide et al. | ..................... 330/308 |
| 6,624,683 B1 | * | 9/2003 | Bedarida et al. | ............ 327/427 |
| 7,161,392 B2 | * | 1/2007 | Nakamura | .................... 327/58 |
| 7,382,166 B1 | * | 6/2008 | Ide | .............................. 327/62 |
| 2006/0012401 A1 | * | 1/2006 | Yoshihara | ................... 326/133 |

FOREIGN PATENT DOCUMENTS

| | | |
|---|---|---|
| JP | 09-270755 | 10/1997 |
| JP | 10-013359 | 1/1998 |

* cited by examiner

*Primary Examiner*—Long Nguyen

(57) ABSTRACT

An amplifying unit performs a differential amplification with a highest level or a lowest level of an input signal and a previous input signal. A semiconductor element transfers a signal level output from the amplifying unit from a second terminal to a third terminal by using a current conducted from the second terminal to the third terminal in response to a voltage applied to a first terminal. A control unit controls the voltage applied to the first terminal of the semiconductor element based on a voltage or a current related to a reference semiconductor element. A holding unit holds a signal level output from the third terminal of the semiconductor element.

11 Claims, 17 Drawing Sheets

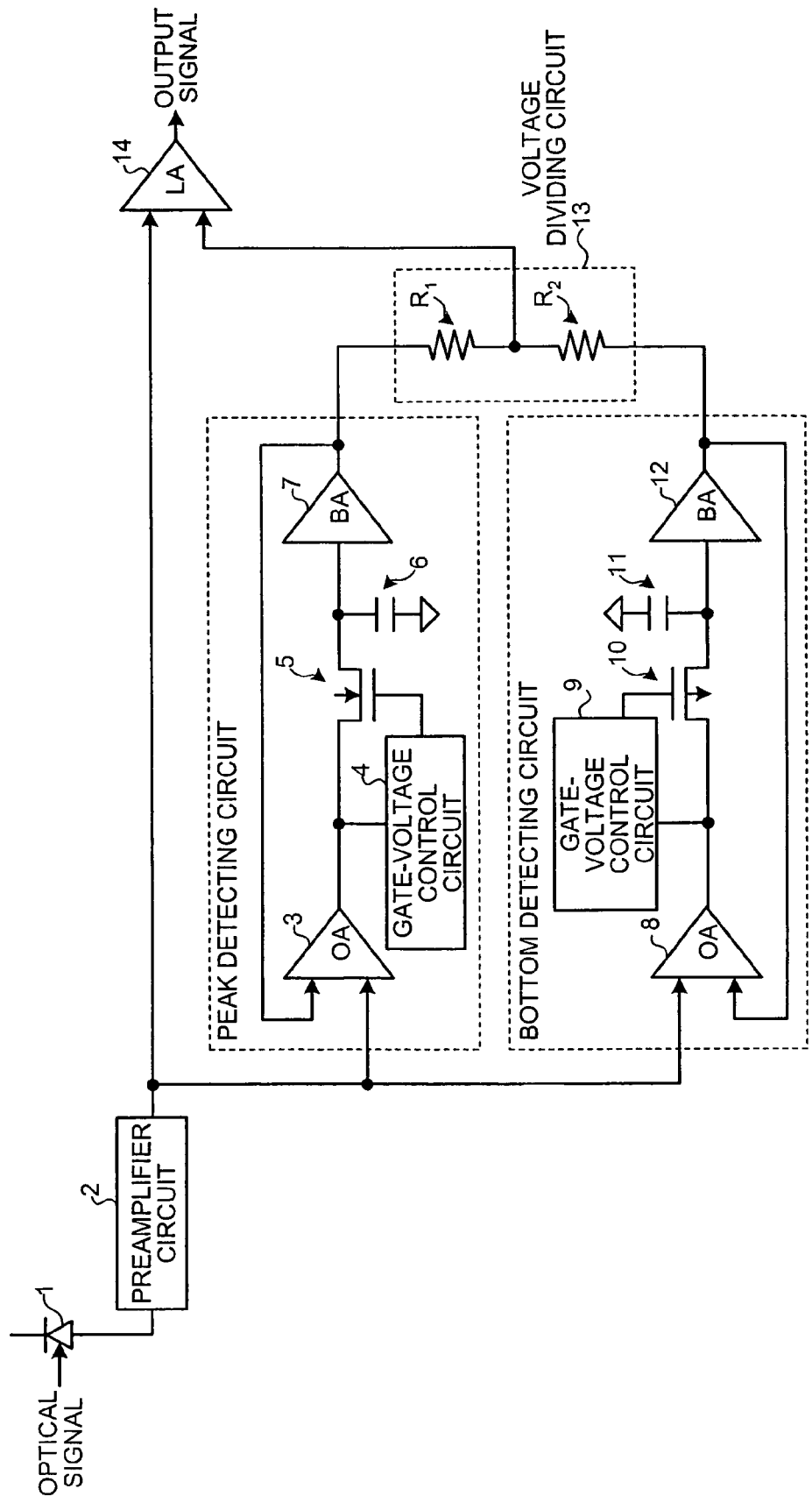

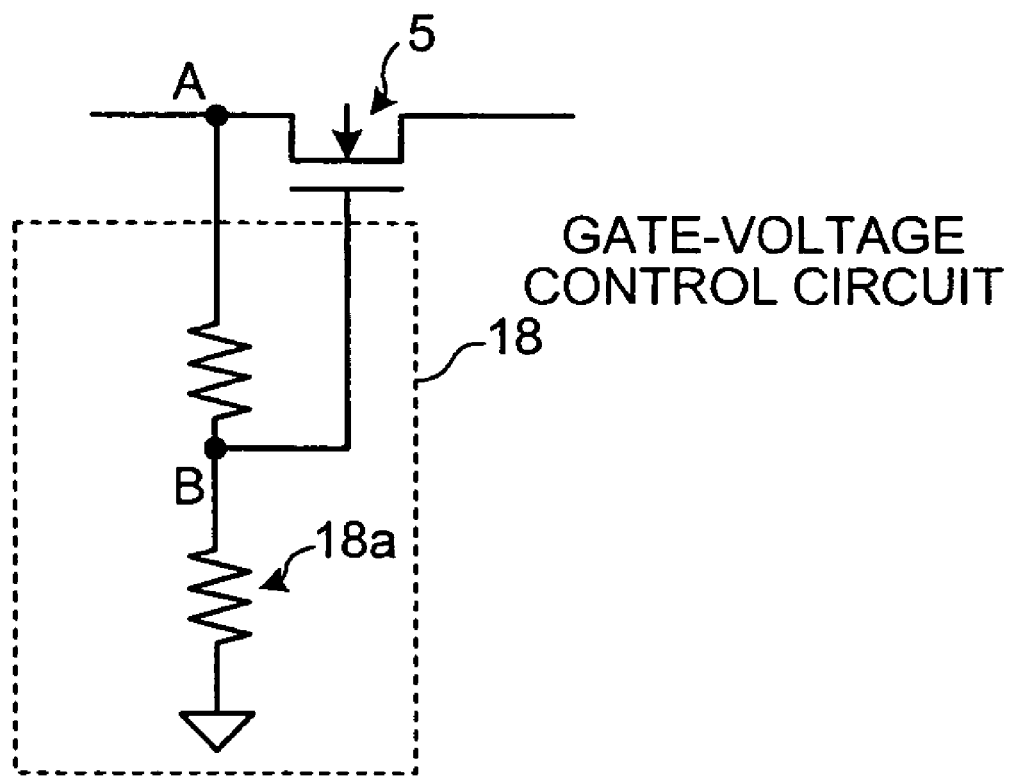

SIGNAL-LEVEL DETECTING APPARATUS, OPTICAL RECEIVER, AND SIGNAL-LEVEL DETECTING METHOD

BACKGROUND OF THE INVENTION

1. Field of the Invention

The present invention generally relates to a technology for detecting either one of a peak level and a bottom level of an input signal, with a capability of suppressing a leak current without losing an instantaneous response characteristic.

2. Description of the Related Art

In recent years, the establishment of broadband optical access networks, which have a high speed and a high capacity, has rapidly developed to cater to the increase in data traffic due to wide use of the Internet or the like. A specific example of a high-speed optical access system is a Gigabit-Passive Optical Network (G-PON), which is able to realize transmission at a speed as high as 1 Gbps at maximum.

In an optical access system like a G-PON, an optical splitter that splits an optical fiber is provided between a plurality of apparatuses on the subscribers' side (Optical Network Units (ONUs)) and an apparatus on the station side (an Optical Line Terminal (OLT)). Thus, the one optical fiber is shared by the plurality of ONUs. In the upstream transmission from the ONUs to the OLT, the Time Division Multiple Access (TDMA) method is used. The transmission timing is controlled so that optical packets transmitted from the plurality of ONUs do not collide with one another. For this reason, it is necessary for the OLT to have an optical burst receiver that instantly identifies optical packet signals that arrive from the ONUs in a burst manner.

The strength of the optical packet signals varies highly depending on the difference in transmission loss among the ONUs. For example, the variation ranges from 100 times to 1000 times. Thus, the OLT is required to have a very wide dynamic range. Further, a preamble that is positioned at the head of an optical packet signal and that corresponds to a rise time is extremely short, for example, tens of bits. Thus, it is necessary for the OLT to receive signals of which the levels vary so highly during the course of time and to decide the logic of the signals within the preamble period. Furthermore, a guard time that is provided between optical packet signals and that corresponds to a non-transmission period is also extremely short. During the guard time, an initialization process is performed with a reset signal, and the next optical packet signal is awaited.

As explained above, it is necessary for the OLT in the optical access system to identify the optical packet signals instantly. Thus, as disclosed in Japanese Patent Application Laid-open No. 9-270755, sometimes a method is used in which the peak level and the bottom level of a signal are detected so that a level at the center between the peak level and the bottom level is used as a threshold value to decide the logic of the signals thereafter. In other words, by determining the threshold level based on the peak level and the bottom level that are detected in the preamble portion of the signal, it is possible to accurately decide the logic with regard to the data portion of the signal.

From the point of view of reducing cost, it is desirable to manufacture optical receivers that are to be used in optical access systems, based on the technology related to Complementary Metal Oxide Semiconductors (CMOS) that include a Field Effect Transistor (FET). However, in a circuit in which a high-speed CMOS is used, a problem arises where a leak current occurs due to process variations, during the detection process of the peak level and the bottom level. Particularly, when signals having the same logic in the data portion appear in succession, there is a variation in the storing of the peak level or the bottom level of the signals. Thus, the variation in the threshold value due to a leak current is noticeable when the same logics appear in succession.

One of the ways to inhibit the occurrence of the leak current is to make the gate length of the FET included in the CMOS longer. However, when the gate length is longer, the rising and the falling at the head of an optical packet signal become slower, and thus, the instantaneous response characteristic is degraded. When the instantaneous response characteristic is degraded, the determination process of a threshold level cannot be completed within the preamble portion of the signal. Accordingly, it may not be possible to make decision on the logic in the data portion accurately.

SUMMARY OF THE INVENTION

It is an object of the present invention to at least partially solve the problems in the conventional technology.

A signal-level detecting apparatus according to one aspect of the present invention detects either one of a peak level and a bottom level of an input signal. The signal-level detecting apparatus includes an amplifying unit that performs a differential amplification with either one of a highest level and a lowest level of the input signal and a previous input signal; a semiconductor element that includes a first terminal, a second terminal, and a third terminal, and transfers a signal level output from the amplifying unit from the second terminal to the third terminal by using a current that is conducted from the second terminal to the third terminal in response to a voltage applied to the first terminal; a control unit that includes a reference semiconductor element having a substantially same characteristic as the semiconductor element, and controls the voltage applied to the first terminal of the semiconductor element based on either one of a voltage and a current related to the reference semiconductor element; and a holding unit that holds a signal level output from the third terminal of the semiconductor element.

A signal-level detecting apparatus according to another aspect of the present invention detects either one of a peak level and a bottom level of an input signal. The signal-level detecting apparatus includes a differential amplifier that performs a differential amplification with either one of a highest level and a lowest level of the input signal and a previous input signal; a transistor element that transfers a voltage level output from the differential amplifier by using a current that is conducted in response to a gate voltage; a control circuit that includes a reference transistor element having a substantially same characteristic as the transistor element, and controls the gate voltage of the transistor element based on either one of a voltage and a current related to the reference transistor element; and a capacitor that is charged by the voltage level transferred by the transistor element.

An optical receiver according to still another aspect of the present invention includes a signal-level detecting apparatus that detects either one of a peak level and a bottom level of an input signal, the signal-level detecting apparatus including an amplifying unit that performs a differential amplification with either one of a highest level and a lowest level of the input signal and a previous input signal, a semiconductor element that includes a first terminal, a second terminal, and a third terminal, and transfers a signal level output from the amplifying unit from the second terminal to the third terminal by using a current that is conducted from the second terminal to the third terminal in response to a voltage applied to the first terminal, a control unit that includes a reference semiconductor element having a substantially same characteristic as the semiconductor element, and controls the voltage applied to the first terminal of the semiconductor element based on either one of a voltage and a current related to the reference semiconductor element, and a holding unit that holds a signal level output from the third terminal of the semiconductor element; a receiving unit that receives an optical signal; a preamplifier unit that preamplifies the optical signal received by the receiving unit and outputs the input signal to the signal-level detecting apparatus; and a deciding unit that decides the input signal with at least one of the peak level and the bottom level of the input signal detected by the signal-level detecting apparatus.

A signal-level detecting method according to still another aspect of the present invention is for detecting either one of a peak level and a bottom level of an input signal. The signal-level detecting method includes performing a differential amplification with either one of a highest level and a lowest level of the input signal and a previous input signal; controlling a voltage applied to a first terminal of a semiconductor element based on either one of a voltage and a current related to a reference semiconductor element that has a substantially same characteristic as the semiconductor element that transfers a signal level output at the amplifying from a second terminal to a third terminal; transferring the signal level output at the amplifying from the second terminal to the third terminal by using a current that is conducted from the second terminal to the third terminal in response to the voltage applied to the first terminal of the semiconductor element; and holding a signal level output from the third terminal of the semiconductor element.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 1 is a diagram of a principal configuration of an optical receiver according to a first embodiment of the present invention;

FIG. 19 is a diagram of an internal configuration of a gate-voltage control circuit according to the seventh embodiment.

DETAILED DESCRIPTION OF THE PREFERRED EMBODIMENTS

Figure 2A:
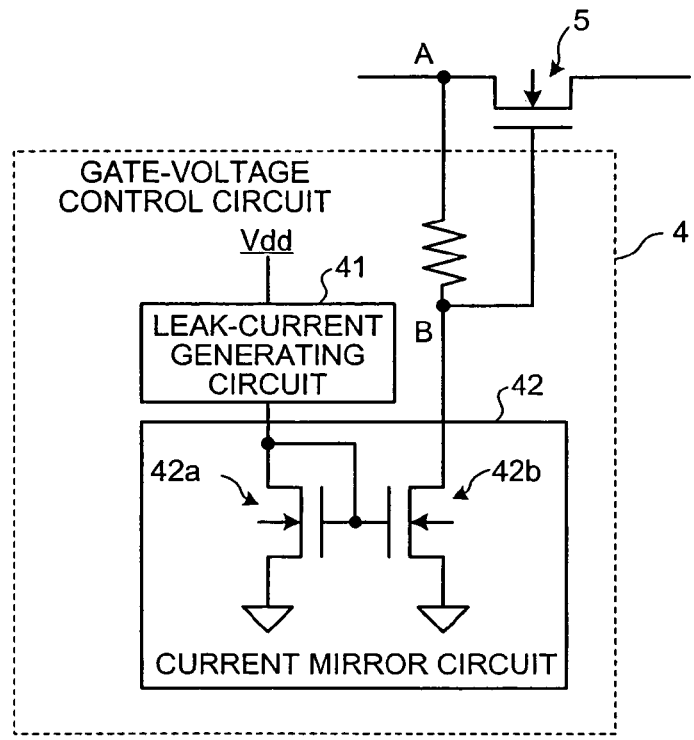
FIG. 2A is a diagram of an internal configuration of a gate-voltage control circuit according to the first embodiment.

Exemplary embodiments of the prevent invention will be explained in detail with reference to the accompanying drawings.

FIG. 1 is a diagram of a principal configuration of an optical burst receiver that includes a signal-level detecting apparatus according to a first embodiment of the present invention. As the main constituent elements, the optical receiver shown in the drawing includes a photo diode 1, a preamplifier circuit 2, a peak detecting circuit, a bottom detecting circuit, a voltage dividing circuit 13, and a limiting amplifier (hereinafter, "LA") 14. Among these, each of the peak detecting circuit and the bottom detecting circuit is a signal-level detecting apparatus according to the present invention.

The photo diode 1 receives an optical signal transmitted in an optical fiber, generates a current signal that corresponds to the strength of the received optical signal, and outputs the generated current signal to the preamplifier circuit 2.

The preamplifier circuit 2 converts the current signal to a voltage signal, and outputs the voltage signal to the LA 14, the peak detecting circuit, and the bottom detecting circuit.

The peak detecting circuit detects a peak level from the voltage signal. More specifically, the peak detecting circuit includes a differential amplifier (hereinafter, "OA") 3, a gate-voltage control circuit 4, a Field Effect Transistor (FET) 5, a capacitor 6, and a buffer amplifier (hereinafter, "BA") 7.

The OA 3 performs a differential amplification on a voltage that is returned as feedback from the BA 7 and is stored in the capacitor 6 and the voltage signal output from the preamplifier circuit 2. When the voltage signal is equal to or higher than the voltage stored in the capacitor 6, the OA 3 outputs a differential signal and electrically charges the capacitor 6 positively via the FET 5.

The gate-voltage control circuit 4 applies a negative bias to a gate voltage in correspondence with process variations and environmental conditions of the FET 5 and applies the gate voltage to the FET 5. More specifically, when under a condition where the leak current of the FET 5 increases, for example, when the process has a low threshold voltage or when the temperature is high, the gate-voltage control circuit 4 increases the negative bias applied to the gate voltage. Conversely, when under a condition where the leak current of the FET 5 does not increase, for example, when the process has a high threshold voltage or when the temperature is low, the gate-voltage control circuit 4 decreases the negative bias applied to the gate voltage. The configuration of the gate-voltage control circuit 4 will be described in detail later.

The FET 5 is, for example, an n-type Metal-Oxide Semiconductor FET (MOS-FET). The FET 5 conducts electricity in correspondence with the gate voltage varying under the control of the gate-voltage control circuit 4. The FET 5 electrically charges the capacitor 6 positively, using the differential signal output by the OA 3. At this time, because the negative bias is applied to the gate voltage by the gate-voltage control circuit 4, the FET 5 decreases the conducted current by as much as the negative bias. Thus, because the negative bias is appropriately controlled by the gate-voltage control circuit 4, the decreased current corresponds to a leak current.

One end of the capacitor 6 is connected to a ground. By being electrically charged positively with the differential signal output from the OA 3, the capacitor 6 stores therein the peak level of the voltage signal output from the preamplifier circuit 2. The level stored by the capacitor 6 is discharged and initialized by a reset signal, during a guard time between two signals.

The BA 7 is, for example, a source follower. The BA 7 buffers the peak level voltage stored in the capacitor 6 to low impedance and outputs with low impedance.

The bottom detecting circuit detects a bottom level from the voltage signal. More specifically, the bottom detecting circuit includes an OA 8, a gate-voltage control circuit 9, an FET 10, a capacitor 11, and a BA 12.

The OA 8 performs a differential amplification on a voltage that is returned as feedback from the BA 12 and is stored in the capacitor 11 and the voltage signal output from the preamplifier circuit 2. When the voltage signal is equal to or lower than the voltage stored in the capacitor 11, the OA 8 outputs a differential signal and electrically charges the capacitor 11 negatively via the FET 10.

The gate-voltage control circuit 9 applies a negative bias to a gate voltage in correspondence with process-variations and environmental conditions of the FET 10 and applies the gate voltage to the FET 10. More specifically, when under a condition where the leak current of the FET 10 increases, for example, when the process has a low threshold voltage or when the temperature is high, the gate-voltage control circuit 9 increases the negative bias applied to the gate voltage. Conversely, when under a condition where the leak current of the FET 10 does not increase, for example, when the process has a high threshold voltage or when the temperature is low, the gate-voltage control circuit 9 decreases the negative bias applied to the gate voltage. The configuration of the gate-voltage control circuit 9 will be described in detail later.

The FET 10 is, for example, a p-type MOS-FET. The FET 10 conducts electricity in correspondence with the gate voltage varying under the control of the gate-voltage control circuit 9. The FET 10 electrically charges the capacitor 11 negatively, using the differential signal output by the OA 8. At this time, because the negative bias is applied to the gate voltage by the gate-voltage control circuit 9, the FET 10 decreases the conducted current by as much as the negative bias. Thus, because the negative bias is appropriately controlled by the gate-voltage control circuit 9, the decreased current corresponds to a leak current.

One end of the capacitor 11 is connected to a ground. By being electrically charged negatively with the differential signal output from the OA 8, the capacitor 11 stores therein the bottom level of the voltage signal output from the preamplifier circuit 2. The level stored by the capacitor 11 is discharged and initialized by a reset signal, during a guard time between two signals.

The BA 12 is, for example, a source follower. The BA 12 buffers the bottom level voltage stored in the capacitor 11 to low impedance and outputs with low impedance.

The voltage dividing circuit 13 includes a resistor element $R_1$ and a resistor element $R_2$ that have the same resistance value as each other. The voltage dividing circuit 13 outputs a threshold level to the LA 14, the threshold level being a level at the center between the peak level output by the peak detecting circuit and the bottom level output by the bottom detecting circuit.

The LA 14 compares the voltage signal output from the preamplifier circuit 2 with the threshold level output by the voltage dividing circuit 13. When the voltage signal is equal to or higher than the threshold level, the LA 14 outputs "1" as an output signal, where as when the voltage signal is lower than the threshold level, the LA 14 outputs "0" as an output signal.

Next, the internal configurations of the gate-voltage control circuit 4 and the gate-voltage control circuit 9 will be explained. First, FIG. 2A is a diagram of the internal configuration of the gate-voltage control circuit 4 included in the peak detecting circuit. As shown in the drawing, the gate-voltage control circuit 4 according to the first embodiment includes a leak-current generating circuit 41 and a current mirror circuit 42.

The leak-current generating circuit 41 generates a leak current being equivalent to the leak current that occurs in the FET 5. More specifically, the leak-current generating circuit 41 is configured to include, for example, an FET that has substantially the same characteristic as the FET 5. The leak-current generating circuit 41 generates a leak current that may occur in the FET 5 in correspondence with the process variations and the environmental conditions. In other words, the leak-current generating circuit 41 generates a high leak current, when under a condition that makes the leak current occurring in the FET 5 high. Conversely, the leak-current generating circuit 41 generates a low leak current, when under a condition that makes the leak current occurring in the FET 5 low. More specifically, the leak-current generating circuit 41 generates a high leak current, when the process has a low threshold voltage or when the temperature is high. Conversely, the leak-current generating circuit 41 generates a low leak current, when the process has a high threshold voltage or when the temperature is low.

The current mirror circuit 42 includes an FET 42a and an FET 42b. When the leak current generated by the leak-current generating circuit 41 is conducted through the FET 42a, a current that corresponds to the leak current is conducted through the FET 42b. The current mirror circuit 42 makes the voltage at the point B in the drawing lower than the voltage at the point A in the drawing (i.e. applies a negative bias), using the current conducted through the FET 42b, and applies the voltage at the point B to the FET 5, as the gate voltage.

Figure 2B:
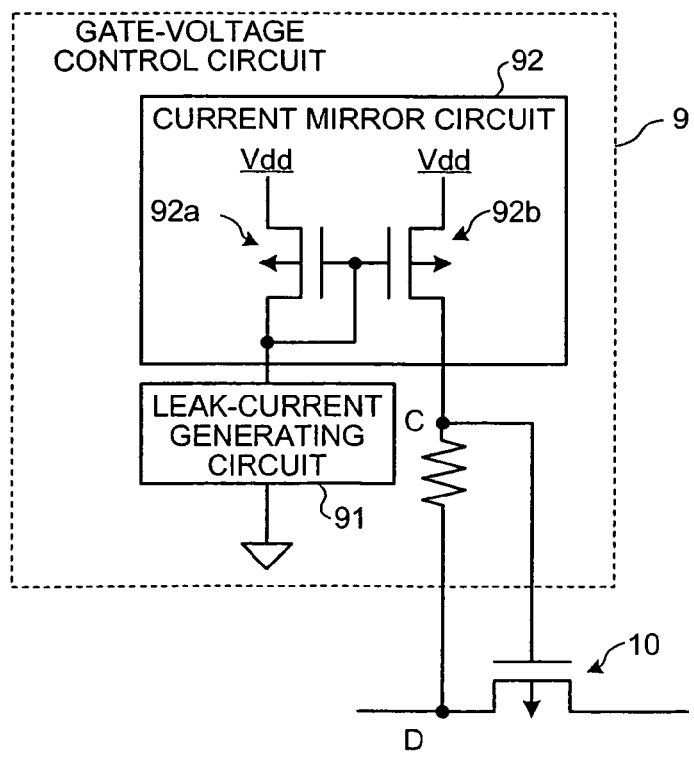
FIG. 2B is a diagram of another internal configuration of the gate-voltage control circuit according to the first embodiment.

On the other hand, FIG. 2B is a diagram of the internal configuration of the gate-voltage control circuit 9 included in the bottom detecting circuit. As shown in the drawing, the gate-voltage control circuit 9 according to the first embodiment includes a leak-current generating circuit 91 and a current mirror circuit 92.

The leak-current generating circuit 91 generates a leak current being equivalent to the leak current occurring in the FET 10. More specifically, the leak-current generating circuit 91 is configured to include, for example, an FET that has substantially the same characteristic as the FET 10. The leak-current generating circuit 91 generates a leak current that may occur in the FET 10 in correspondence with the process variations and the environmental conditions. In other words, the leak-current generating circuit 91 generates a high leak current, when under a condition that makes the leak current occurring in the FET 10 high. Conversely, the leak-current generating circuit 91 generates a low leak current, when under a condition that makes the leak current occurring in the FET 10 low. More specifically, the leak-current generating circuit 91 generates a high leak current, when the process has a low threshold voltage or when the temperature is high. Conversely, the leak-current generating circuit 91 generates a low leak current, when the process has a high threshold voltage or when the temperature is low.

The current mirror circuit 92 includes an FET 92a and an FET 92b. When the leak current generated by the leak-current generating circuit 91 is conducted through the FET 92a, a current that corresponds to the leak current is conducted through the FET 92b. The current mirror circuit 92 makes the voltage at the point C in the drawing higher than the voltage at the point D in the drawing (i.e. applies a negative bias), using the current conducted through the FET 92b, and applies the voltage at the point C to the FET 10, as the gate voltage. In this situation, because, for example, a p-type MOS-FET is used as the FET in the bottom detecting circuit, the direction in which the gate voltage becomes higher corresponds to a negative bias, on the contrary to the example in the peak detecting circuit.

As explained so far, according to the first embodiment, the leak current that corresponds to the process variations and the environmental conditions is actually generated in each of the gate-voltage control circuit 4 and the gate-voltage control circuit 9. Accordingly, the negative bias is applied to the gate voltage, using the generated leak current. Thus, the gate voltage is adaptively controlled in correspondence with the process variations and the environmental conditions, and also the current conducted through each of the FET 5 and the FET 10 is adjusted. With these arrangements, the current is reduced by as much as the leak current that would have originally occurred in each of the FET 5 and the FET 10. Thus, the occurrence of the leak current is inhibited. In addition, according to the first embodiment, it is not necessary to make the gate length of each of the FET 5 and the FET 10 higher, the instantaneous response characteristic does not get degraded highly, either.

Figure 3:
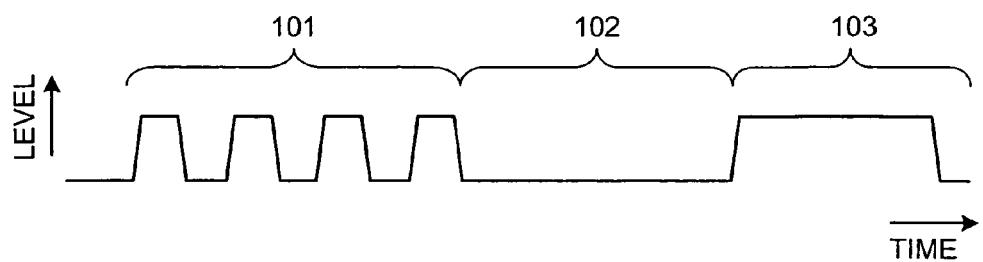
FIG. 3 is a drawing of an example of an input signal according to the first embodiment.

Next, a specific example of the threshold value controlling operation according to the first embodiment will be explained. FIG. 3 is a drawing of an example of an optical signal input to the optical receiver according to the first embodiment. As shown in the drawing, the optical signal according to the first embodiment has, at the head thereof, a preamble portion 101 in which "1" and "0" are arranged in a fixed pattern. In addition, in FIG. 3, a data portion 102 in which "0" appears in succession and a data portion 103 in which "1" appears in succession are illustrated so as to follow the preamble portion 101.

After such a signal is converted into a voltage signal by the preamplifier circuit 2, and when the voltage signal is input to the peak detecting circuit, the peak detecting circuit outputs a differential signal from the OA 3, only if the voltage signal is higher than the voltage stored in the capacitor 6. The capacitor 6 is electrically charged by the differential signal via the FET 5. Due to this arrangement, the FET 5 does not conduct electricity thereafter, unless the voltage signal input to the peak detecting circuit has a further higher voltage level.

In this situation, in the gate-voltage control circuit 4, the leak-current generating circuit 41 generates the leak current. The gate voltage of the FET 5 is a voltage (i.e. the voltage at the point B in FIG. 2A) obtained by applying a negative bias, using the current that flows in the current mirror circuit 42 in correspondence with the leak current, to the voltage (i.e. the voltage at the point A in FIG. 2A) of the differential signal output from the OA 3. Because the leak-current generating circuit 41 includes the FET that has substantially the same characteristic as the FET 5, it is possible to apply, to the gate voltage, the negative bias that corresponds to the leak current that may occur in the FET 5 in the environment at the current point in time and thereby to adjust the current that is conducted through the FET 5. As a result, it is possible to inhibit the occurrence of the leak current in the FET 5.

More specifically, when under a condition where a leak current occurs easily, for example, when the process has a low threshold voltage or when the temperature is high, the leak current generated by the leak-current generating circuit 41 is also high. Accordingly, the current that flows in the FET 42b included in the current mirror circuit 42 is also high. As a result, the difference between the voltage at the point A and the voltage at the point B in FIG. 2A is high. This leads to a situation where the gate voltage of the FET 5 becomes low, and the conducted current becomes low. On the contrary, when under a condition where a leak current does not occur easily, for example, when the process has a high threshold voltage or when the temperature is low, the gate voltage of the FET 5 becomes high, and the conducted current becomes high. As a result, the increase or the decrease in the leak current due to a change in the conditions such as an environmental condition is absorbed by the current conducted through the FET 5. Thus, the occurrence of the leak current is inhibited.

Figure 4A:
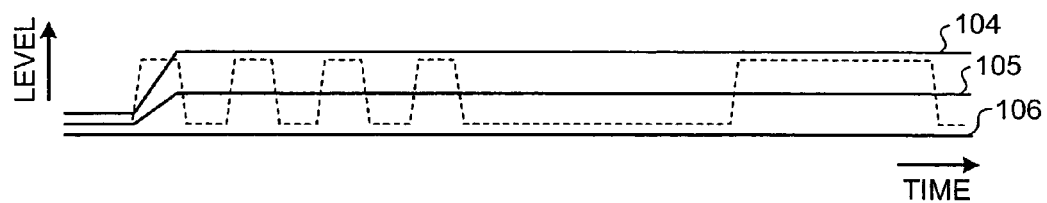
FIG. 4A is a drawing of an example of a threshold value controlling operation according to the first embodiment.

The operation described above is performed when the preamble portion 101 of an optical signal like the one shown in FIG. 3 is received. As shown in FIG. 4A, a peak level 104 that corresponds to the highest voltage level in the preamble portion 101 is stored into the capacitor 6. In the same fashion, in the bottom detecting circuit, the occurrence of the leak current in the FET 10 is inhibited under the control of the gate-voltage control circuit 9. A bottom level 106 that corresponds to the lowest voltage level in the preamble portion 101 is stored into the capacitor 11. In FIG. 4A, the optical signal being input is indicated with a broken line.

Figure 4B:
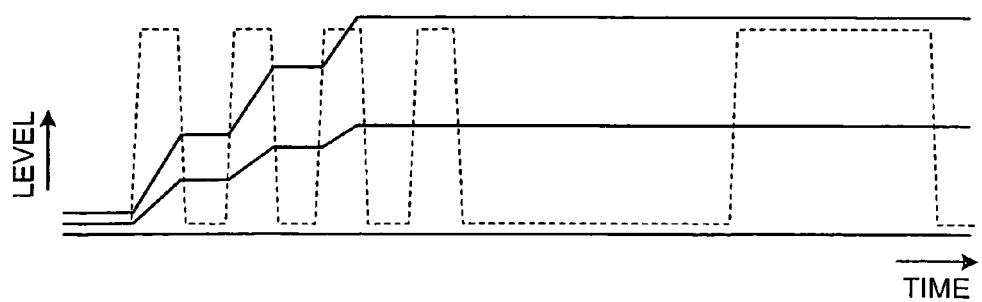
FIG. 4B is a drawing of another example of the threshold value controlling operation according to the first embodiment.

Subsequently, the peak level 104 and the bottom level 106 are input to the voltage dividing circuit 13. A threshold level 105, which is the level at the center between the peak level 104 and the bottom level 106, is output from the voltage dividing circuit 13 to the LA 14. Accordingly, when the data portion 103 is input to the LA 14, the LA 14 compares the voltage level of the data portion 103 with the threshold level 105 and decides whether the data portion 103 is "1" or "0". Further, even if the average level of the optical signal that is input is high, because it is not that the gate length of the FET 5 is arranged to be higher, the instantaneous response characteristic is not lost. Consequently, as shown in FIG. 4B, it is possible to detect the peak level accurately within the period of time in which the preamble portion is being received.

As explained so far, according to the first embodiment, the negative bias that corresponds to the environmental conditions is applied to the gate voltage of the FET. Thus, it is possible to adjust the current that is conducted through the FET without having to make the gate length higher. It is also possible to inhibit the occurrence of the leak current without losing the instantaneous response characteristic.

Figure 5:
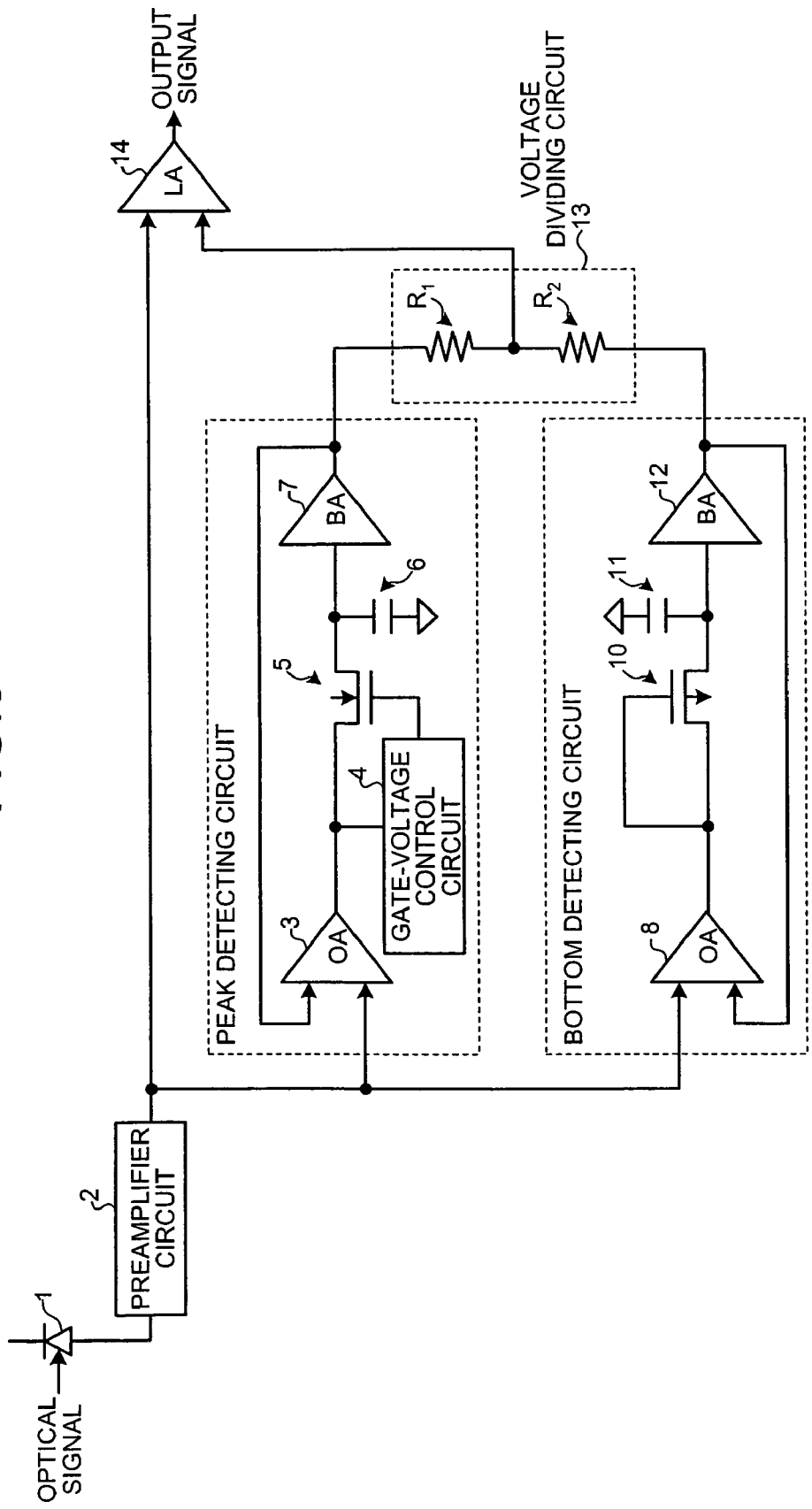
FIG. 5 is a diagram of a principal configuration of another optical receiver according to the first embodiment.

In the description of the first embodiment, the peak detecting circuit includes the gate-voltage control circuit 4, and the bottom detecting circuit includes the gate-voltage control circuit 9; however, if it is understood in advance that the leak current occurs easily only at one of the peak level and the bottom level, another configuration is acceptable in which only one of the peak detecting circuit and the bottom detecting circuit includes a gate-voltage control circuit. In such a situation, for example, as shown in FIG. 5, the peak detecting circuit includes the gate-voltage control circuit 4, although in the bottom detecting circuit, the voltage level of the differential signal output from the OA 8 is used, as it is, as the gate voltage of the FET 10.

The characteristics of a second embodiment of the present invention lies in that a fixed bias is applied to the FET in the gate-voltage control circuit, and a negative bias is applied to an FET in which the leak current is the target of inhibition, using a leak current generated in correspondence with the process variations and the environmental conditions.

The principal configuration of an optical receiver according to the second embodiment is the same as the one according to the first embodiment (FIG. 1). Thus, the explanation thereof will be omitted. According to the second embodiment, only the internal configurations of the gate-voltage control circuit 4 and the gate-voltage control circuit 9 are different from those according to the first embodiment.

Figure 6A:
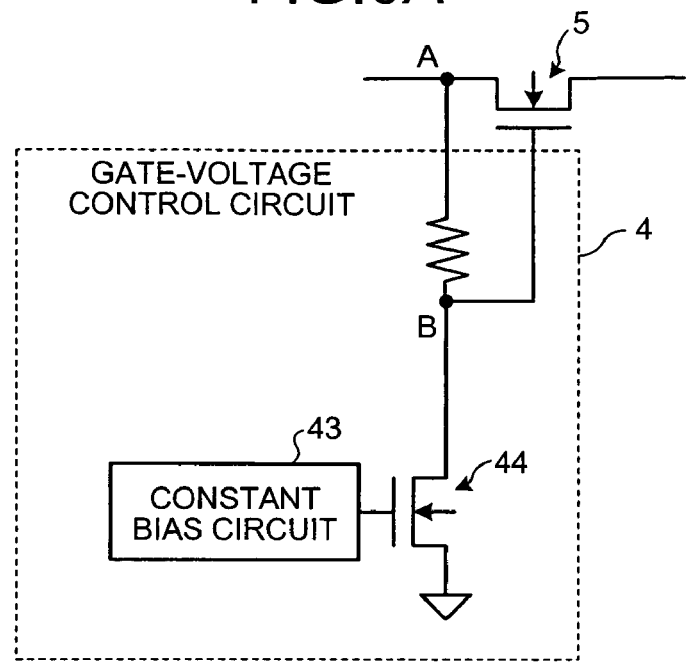
FIG. 6A is a diagram of an internal configuration of a gate-voltage control circuit according to a second embodiment of the present invention.

FIG. 6A is a diagram of the internal configuration of the gate-voltage control circuit 4 included in a peak detecting circuit. As shown in the drawing, the gate-voltage control circuit 4 according to the second embodiment includes a constant bias circuit 43 and an FET 44.

The constant bias circuit 43 generates a constant bias and applies a gate voltage $V_B$ that is always constant to the FET 44. The gate voltage $V_B$ is a voltage that is equal to or lower than a threshold voltage $V_{th}$ conducted by the FET 44 and that generates only a leak current in the FET 44.

The FET 44 is an FET that has substantially the same characteristic as the FET 5. When the constant gate voltage $V_B$ is applied to the FET 44, the FET 44 generates a leak current that corresponds to the process variations and the environmental conditions. With the leak current flowing in the FET 44, the voltage at the point B in the drawing is made to be lower than the voltage at the point A in the drawing (i.e. a negative bias is applied). The voltage at the point B is applied to the FET 5, as the gate voltage.

Figure 6B:
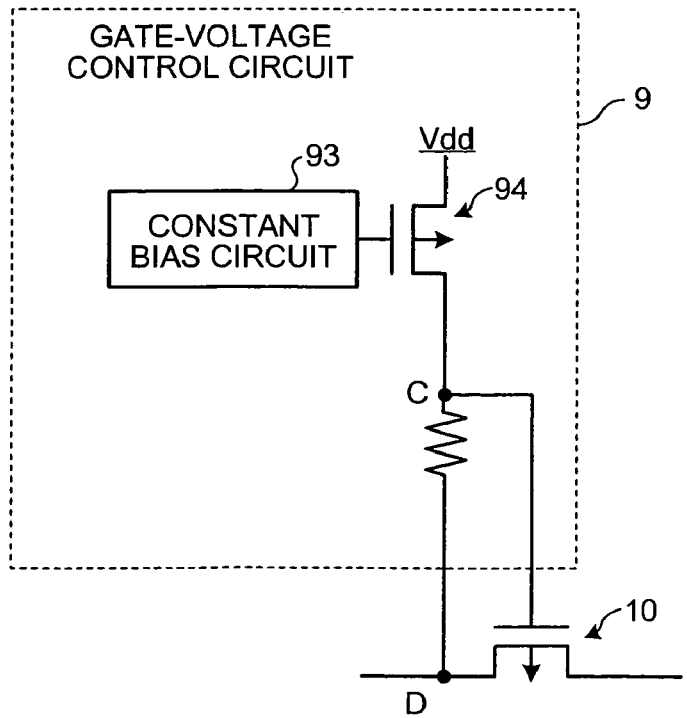
FIG. 6B is a diagram of another internal configuration of the gate-voltage control circuit according to the second embodiment.

On the other hand, FIG. 6B is a diagram of the internal configuration of the gate-voltage control circuit 9 included in a bottom detecting circuit. As shown in the drawing, the gate-voltage control circuit 9 according to the second embodiment includes a constant bias circuit 93 and an FET 94.

The constant bias circuit 93 generates a constant bias and applies a gate voltage that is always constant to the FET 94. The gate voltage is a voltage that is equal to or lower than a threshold voltage conducted by the FET 94 and that generates only a leak current in the FET 94.

The FET 94 is an FET that has substantially the same characteristic as the FET 10. When the constant gate voltage is applied to the FET 94, the FET 94 generates a leak current that corresponds to the process variations and the environmental conditions. With the leak current flowing in the FET 94, the voltage at the point C in the drawing is made to be higher than the voltage at the point D in the drawing (i.e. a negative bias is applied). The voltage at the point C is applied to the FET 10, as the gate voltage. In this situation, because a p-type MOS-FET or the like is used as the FET in the bottom detecting circuit, the direction in which the gate voltage becomes higher corresponds to a negative bias, on the contrary to the example in the peak detecting circuit.

Figure 7:
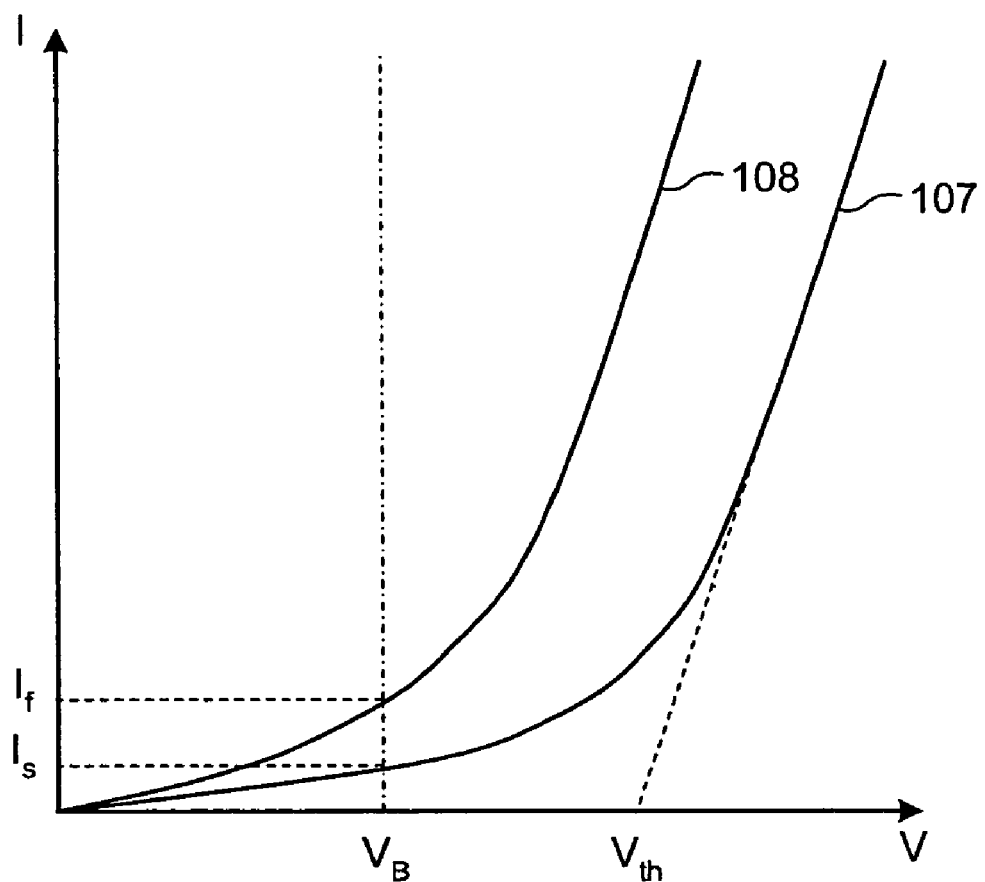
FIG. 7 is a drawing of an example of a current generated in the gate-voltage control circuit according to the second embodiment.

As explained above, according to the second embodiment, the constant gate voltage is applied to the FET, and the negative bias is applied, using the leak current generated in the FET. When the same gate voltage is applied, the leak current generated in the FET is high when the process has a low threshold voltage, whereas the leak current generated in the FET is low when the process has a high threshold voltage. In other words, for example, in the gate-voltage control circuit 4, when the gate voltage $V_B$ as shown in FIG. 7 is applied to the FET 44, when the process has a high threshold voltage, which is $V_{th}$, as shown by a curve 107, the generated leak current, which is $I_s$, is low. When the process has a low threshold voltage as shown by a curve 108, the generated leak current, which is $I_f$, is high.

Consequently, when the process has a low threshold value with which a leak current occurs easily in the FET 5, the negative bias is higher with the leak current $I_f$. On the contrary, when the process has a high threshold value, the negative bias is lower with the leak current $I_s$. With this arrangement, the gate voltage is adaptively controlled in correspondence with the process variations and the environmental conditions. Also, the current conducted through the FET 5 is adjusted, and the occurrence of the leak current is inhibited. In addition, according to the second embodiment, because it is not necessary to make the gate length of the FET 5 higher, the instantaneous response characteristic does not get degraded highly, either. Also, in the FET 10 in the bottom detecting circuit, it is possible to inhibit the occurrence of the leak current in the same fashion.

As explained above, according to the second embodiment, a constant gate voltage is applied to the FET included in the gate-voltage control circuit, and a negative bias is applied using the leak current that is generated in correspondence with the process variations and the environmental conditions. Thus, it is possible to inhibit the occurrence of the leak current with a simple circuit configuration.

The characteristic of a third embodiment of the present invention lies in that a threshold voltage of the FET that corresponds to the process variations and the environmental conditions is detected within the gate-voltage control circuit so that a negative bias is applied to the FET in which the leak current is the target of inhibition, using the detected threshold voltage.

The principal configuration of an optical receiver according to the third embodiment is the same as the one according to the first embodiment (FIG. 1). Thus, the explanation thereof will be omitted. According to the third embodiment, only the internal configurations of the gate-voltage control circuit 4 and the gate-voltage control circuit 9 are different from those according to the first embodiment.

Figure 8A:
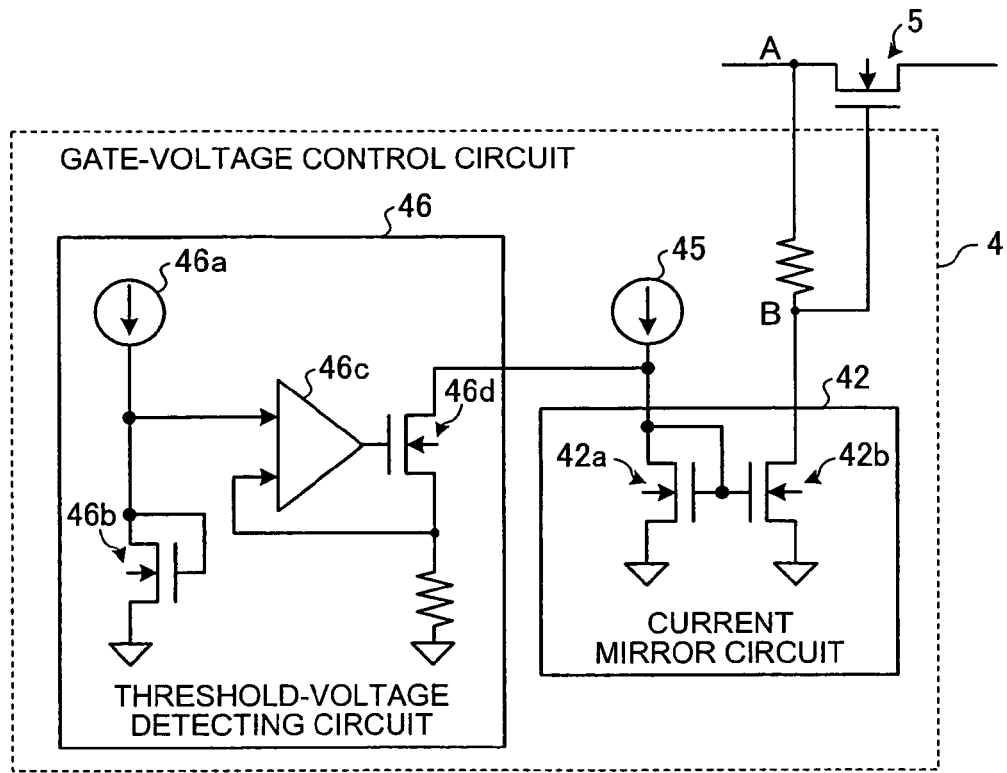
FIG. 8A is a diagram of an internal configuration of a gate-voltage control circuit according to a third embodiment of the present invention.

FIG. 8A is a diagram of an internal configuration of the gate-voltage control circuit 4 included in a peak detecting circuit. In FIG. 8A, the constituent elements that are the same as the ones in FIG. 2A are referred to by using the same reference characters, and the explanation thereof will be omitted. As shown in FIG. 8A, the gate-voltage control circuit 4 according to the third embodiment includes the current mirror circuit 42, a constant current source 45, and a threshold-voltage detecting circuit 46.

The constant current source 45 generates a current that is distributed to the current mirror circuit 42 and the threshold-voltage detecting circuit 46. Because the constant current source 45 generates the current that is always constant, it is possible to increase or decrease the current distributed to the current mirror circuit 42 and to adjust a negative bias, by adjusting the current distributed to the threshold-voltage detecting circuit 46.

The threshold-voltage detecting circuit 46 includes an FET that has substantially the same characteristic as the FET 5 and detects the threshold voltage $V_{th}$ of the FET 5 that corresponds to the process variations and the environmental conditions. More specifically, the threshold-voltage detecting circuit 46 includes a constant current source 46a, an FET 46b, an operational amplifier 46c, and an FET 46d.

The constant current source 46a generates a current $I_b$ by which the threshold voltage $V_{th}$ is applied to the FET 46b.

The FET 46b is an FET that has substantially the same characteristic as the FET 5. When the current $I_b$ is conducted through the FET 46b, the FET 46b detects the threshold voltage $V_{th}$ that corresponds to the process variations and the environmental conditions.

The operational amplifier 46c applies a gate voltage to the FET 46d, using the threshold voltage $V_{th}$ of the FET 46b as an input.

Out of the currents generated by the constant current source 45, the FET 46d conducts a current that corresponds to the threshold voltage $V_{th}$ detected by the FET 46b. The current conducted through the FET 46d changes in correspondence with the threshold voltage $V_{th}$ detected by the FET 46b. Accordingly, the currents that are conducted through the FET 42a and the FET 42b that are included in the current mirror circuit 42 also change. Thus, it is possible to adjust the negative bias applied to the gate voltage of the FET 5. In other words, using the current that flows in the current mirror circuit 42 and corresponds to the threshold voltage $V_{th}$ detected by the FET 46b, the voltage at the point B in the drawing is made to be lower than the voltage at the point A in the drawing (i.e. a negative bias is applied). Then, the voltage at the point B is applied to the FET 5 as the gate voltage.

Figure 8B:
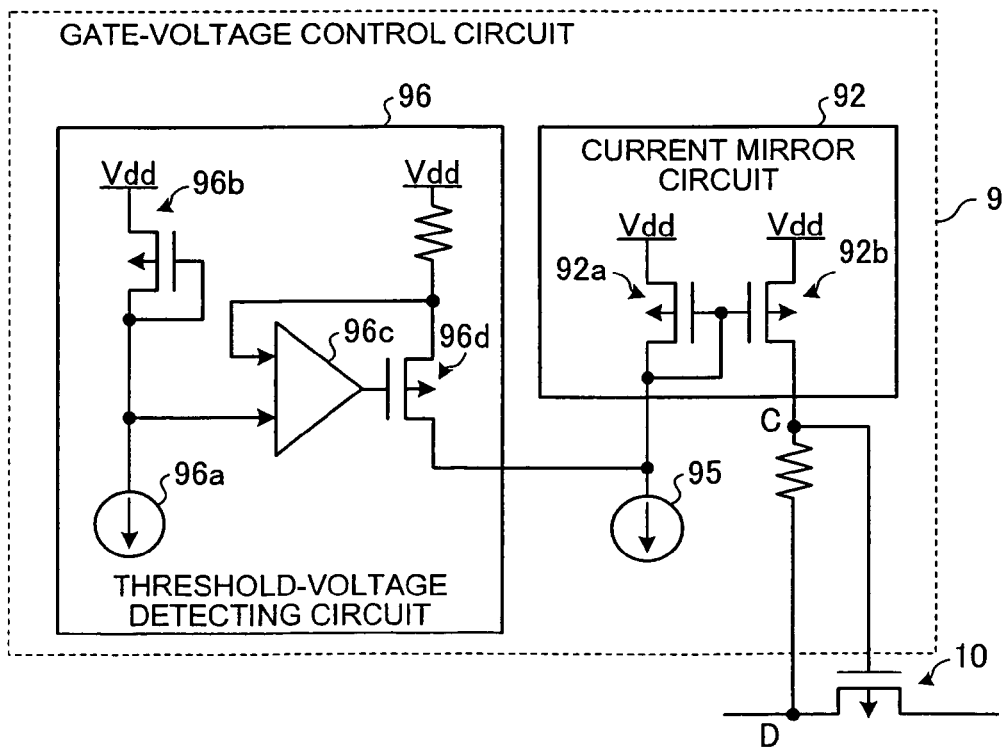
FIG. 8B is a diagram of another internal configuration of the gate-voltage control circuit according to the third embodiment.

On the other hand, FIG. 8B is a diagram of an internal configuration of the gate-voltage control circuit 9 included in a bottom detecting circuit. In FIG. 8B, the constituent elements that are the same as the ones in FIG. 2B are referred to by using the same reference characters, and the explanation thereof will be omitted. As shown in FIG. 8B, the gate-voltage control circuit 9 according to the third embodiment includes the current mirror circuit 92, a constant current source 95, and a threshold-voltage detecting circuit 96.

The constant current source 95 generates a current that is distributed to the current mirror circuit 92 and the threshold-voltage detecting circuit 96. Because the constant current source 95 generates the current that is always constant, it is possible to increase or decrease the current distributed to the current mirror circuit 92 and to adjust a negative bias, by adjusting the current distributed to the threshold-voltage detecting circuit 96.

The threshold-voltage detecting circuit 96 includes an FET that has substantially the same characteristic as the FET 10 and detects a threshold voltage of the FET 10 that corresponds to the process variations and the environmental conditions. More specifically, the threshold-voltage detecting circuit 96 includes a constant current source 96a, an FET 96b, an operational amplifier 96c, and an FET 96d.

The constant current source 96a generates a current by which the threshold voltage is applied to the FET 96b.

The FET 96b is an FET that has substantially the same characteristic as the FET 10. When the current generated by the constant current source 96a is conducted through the FET 96b, the FET 96b detects the threshold voltage that corresponds to the process variations and the environmental conditions.

The operational amplifier 96c applies a gate voltage to the FET 96d, using the threshold voltage of the FET 96b as an input.

Out of the currents generated by the constant current source 95, the FET 96d conducts a current that corresponds to the threshold voltage detected by the FET 96b. The current conducted through the FET 96d changes in correspondence with the threshold voltage detected by the FET 96b. Accordingly, the currents that are conducted through the FET 92a and the FET 92b that are included in the current mirror circuit 92 also change. Thus, it is possible to adjust the negative bias applied to the gate voltage of the FET 10. In other words, using the current that flows in the current mirror circuit 92 and corresponds to the threshold voltage detected by the FET 96b, the voltage at the point C in the drawing is made to be higher than the voltage at the point D in the drawing (i.e. a negative bias is applied). Then, the voltage at the point C is applied to the FET 10 as the gate voltage. In this situation, because a p-type MOS-FET or the like is used as the FET in the bottom detecting circuit, the direction in which the gate voltage becomes higher corresponds to a negative bias, on the contrary to the example in the peak detecting circuit.

Figure 9:
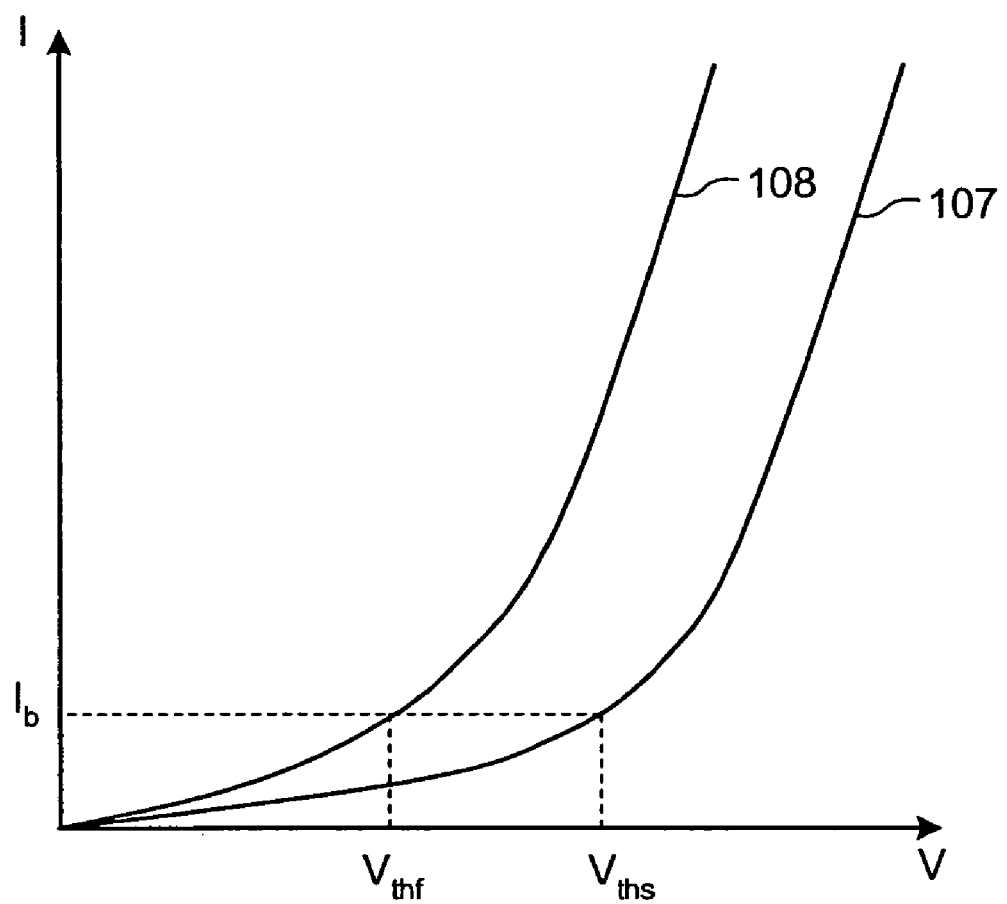
FIG. 9 is a drawing of an example of voltage generated in a threshold-voltage detecting circuit according to the third embodiment.

As explained above, according to the third embodiment, the threshold voltage of the FET that changes in correspondence with the process variations and the environment conditions is detected, and the negative bias is applied using the detected threshold voltage. When the same current is conducted, the threshold voltage of the FET is low when the process has a low threshold voltage, whereas the threshold voltage of the FET is high when the process has a high threshold voltage. In other words, for example, when the current $I_b$ as shown in FIG. 9 is generated in the gate-voltage control circuit 4, the threshold voltage $V_{thf}$ of the process having a lower threshold voltage as indicated with the curve 108 is lower than the threshold voltage $V_{ths}$ of the process having a higher threshold voltage as indicated with the curve 107.

Consequently, when the process has a low threshold value with which a leak current occurs easily in the FET 5, the current that is distributed to the current mirror circuit 92 is higher than other constant currents generated by the constant current source 45. On the contrary, when the process has a high threshold value, the current that is distributed to the current mirror circuit 92 is lower. With this arrangement, a negative bias that corresponds to the process variations and the environmental conditions is applied to the gate voltage of the FET 5, and the occurrence of the leak current is inhibited. In addition, according to the third embodiment, it is not necessary to make the gate length of the FET 5 higher, the instantaneous response characteristic does not get degraded highly, either. As for the FET 10 in the bottom detecting circuit, the occurrence of the leak current is inhibited in the same fashion.

As explained above, according to the third embodiment, the change in the threshold value that corresponds to the process variations and the environmental conditions is detected, so that a negative bias is applied using the detected threshold voltage. Thus, it is possible to inhibit the occurrence of the leak current with the circuit configuration in which the constant current source is used.

The characteristic of a fourth embodiment of the present invention lies in that, using one of a peak level and a bottom level as a reference, the other of the two levels is detected, so that it is possible to control the threshold value accurately, even if a fixed bias is applied to an entire input signal by the nonlinearity of the preamplifier circuit.

Figure 10:
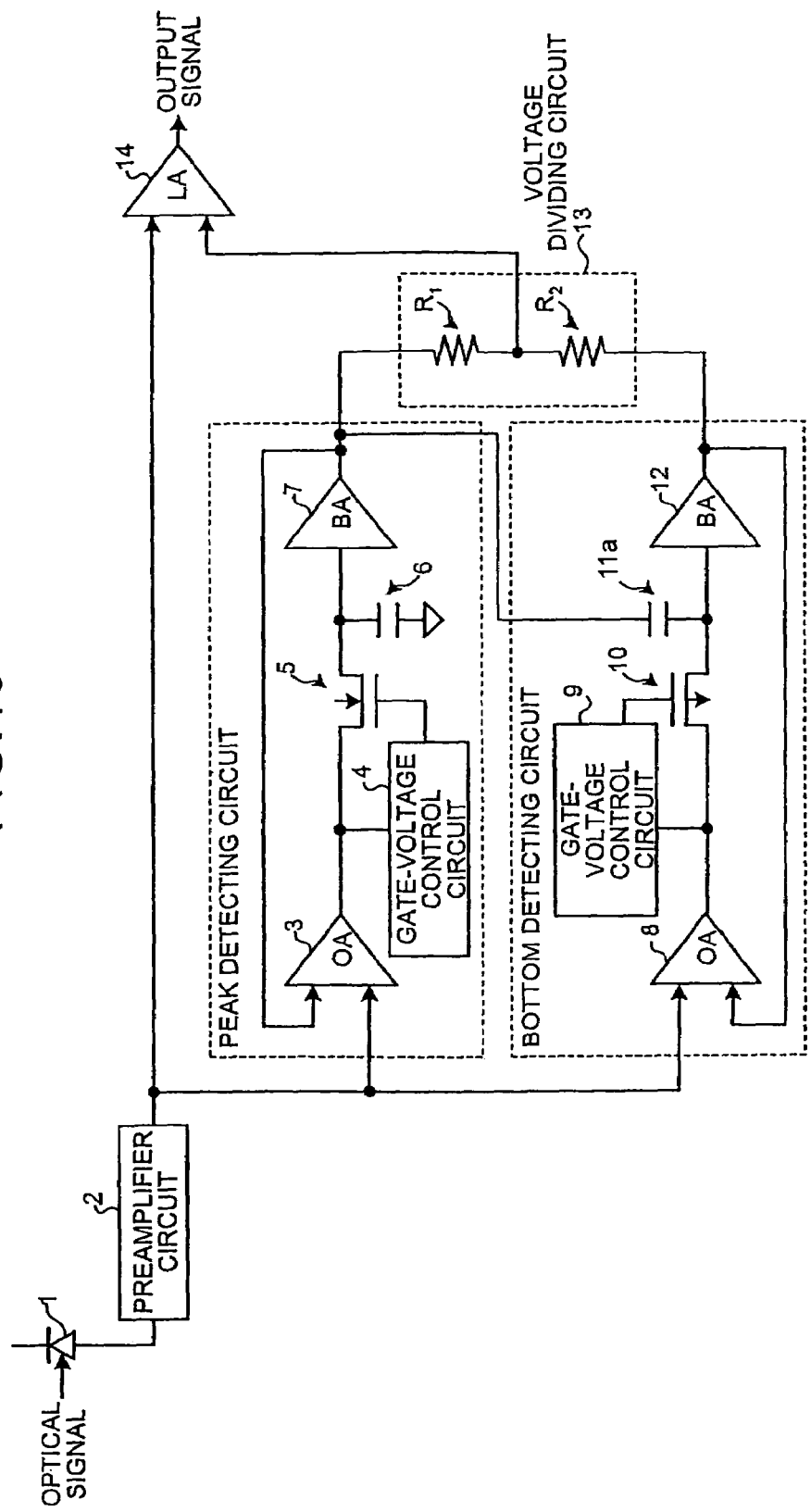
FIG. 10 is a diagram of a principal configuration of an optical receiver according to a fourth embodiment of the present invention.

FIG. 10 is a diagram of a principal configuration of an optical receiver that includes a signal-level detecting apparatus according to the fourth embodiment. In FIG. 10, the constituent elements that are the same as the ones in FIG. 1 are referred to by using the same reference characters, and the explanation thereof will be omitted. The optical receiver shown in FIG. 10 is different from the optical receiver shown in FIG. 1 in that the bottom detecting circuit includes a capacitor 11*a* in place of the capacitor 11.

One end of the capacitor 11*a* is connected to the output side of the BA 7 included in the peak detecting circuit. By being electrically charged negatively with a differential signal output from the OA 8, the capacitor 11*a* stores therein a bottom level that is determined using, as a reference, the peak level of the voltage signal output from the preamplifier circuit 2.

Figure 11:
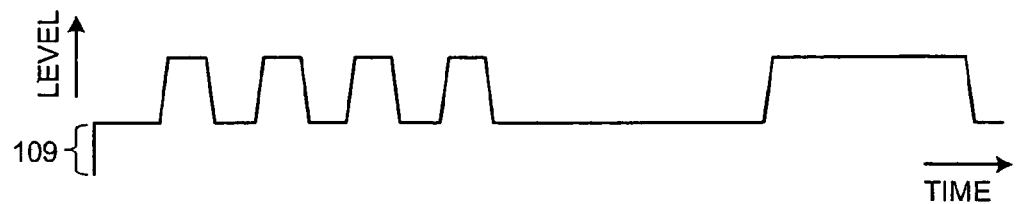
FIG. 11 is a drawing of an example of an input signal according to the fourth embodiment.

According to the fourth embodiment, an input signal of which the waveform has variations of a bias level, as shown in FIG. 11, is supplied to the peak detecting circuit and the bottom detecting circuit. In other words, because an ONU on the transmission source side turns an LD bias on only at the transmission timing of an optical signal, the bottom level of the signal changes during the course of time. The bias level is approximately one tenth of the peak level of the signal at most. However, after the bias level is received by the photo diode 1, a higher bias variation may be caused because of the nonlinearity of the preamplifier circuit 2.

If the peak level and the bottom level of such an input signal are detected individually, the fact that a bias variation 109 is added will not be taken into account. Thus, the peak level and the bottom level of the signal that includes the bias variation 109 will be detected. In this situation, the threshold level, which is a level at the center of the peak level and the bottom level, is not the one obtained based on the peak level and the bottom level of the signal itself. Thus, it will not be possible to decide the logic accurately.

To cope with this situation, according to the fourth embodiment, one end of the capacitor 11*a* is connected to the output side of the BA 7, instead of to a ground, and a bottom level that is obtained by using the peak level as a reference is stored into the capacitor 11*a*. If the logic of the input signal is inverted so that the negative-true logic is applied, one end of the capacitor 11*a* is connected to a ground, while one end of the capacitor 6 is connected to the output side of the BA 12, so that it is possible to store a peak level obtained by using the bottom level as a reference, into the capacitor 6.

Figure 12A:
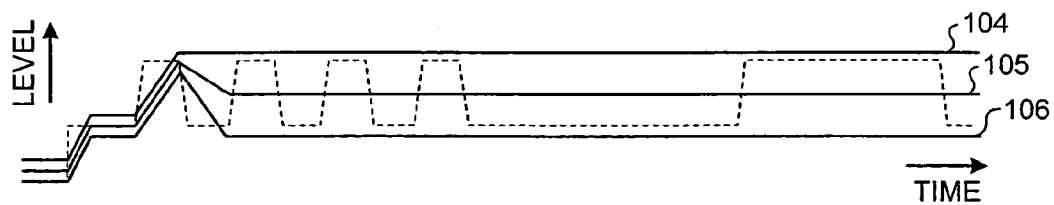
FIG. 12A is a drawing of an example of a threshold value controlling operation according to the fourth embodiment.

The operation described above is performed when the preamble portion of the optical signal shown in FIG. 11 is received. As shown in FIG. 12A, the peak level 104 that corresponds to the highest voltage level in the preamble portion is stored into the capacitor 6. In the bottom detecting circuit, while the input signal level is rising, a bottom level that is equal to the peak level is detected; however, when the input signal level starts falling, a bottom level that is obtained by using the peak level as a reference is detected. Thus, the bottom level 106 obtained by eliminating the fixed bias is stored into the capacitor 11*a*. In FIG. 12A, the input signal is indicated with a broken line.

Figure 12B:
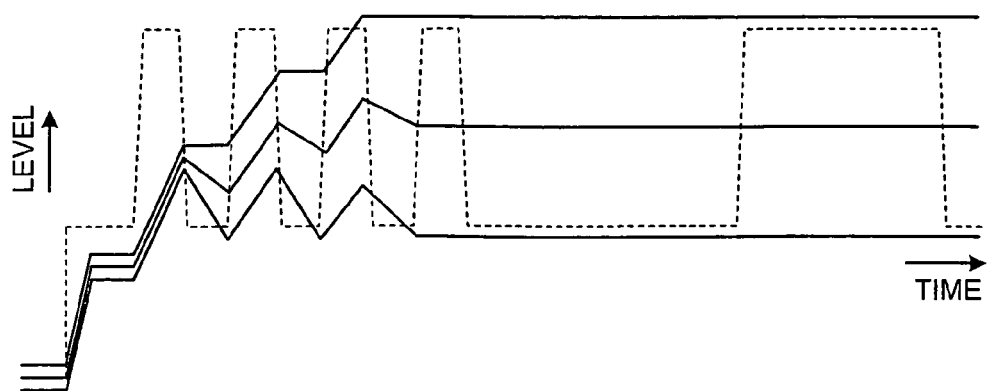
FIG. 12B is a drawing of another example of the threshold value controlling operation according to the fourth embodiment.

Subsequently, the peak level 104 and the bottom level 106 are input to the voltage dividing circuit 13, and the threshold level 105, which is a level at the center between the peak level 104 and the bottom level 106, is output from the voltage dividing circuit 13 to the LA 14. As a result, when the data portion is input to the LA 14, the LA 14 compares the voltage level of the data portion with the threshold level 105 and decides whether the data portion is "1" or "0". Further, even if the average level of the optical signal that is input is high, as shown in FIG. 12B, in a peak section of the input signal, the bottom level gets higher in conjunction with the peak level, whereas in a bottom section of the input signal, only the bottom level gets lower. This phenomenon occurs in a repetitive fashion, and eventually, an accurate bottom level from which the fixed bias is eliminated is detected. In addition, according to the fourth embodiment, because it is not that the gate length of the FET 5 is arranged to be higher, the instantaneous response characteristic is not lost. Consequently, it is possible to detect the peak level and the bottom level accurately within the period of time in which the preamble portion is being received.

In the process described above and the process of deciding the logic in the data portion using the threshold level, the occurrence of the leak current in the FET 5 and the FET 10 is inhibited by the gate-voltage control circuit 4 and the gate-voltage control circuit 9, according to the fourth embodiment as well.

As explained above, according to the fourth embodiment, using one of the peak level and the bottom level as a reference, the other of the two levels is detected. Thus, even if a bias variation is added to the received signal, it is possible to obtain an accurate threshold level that is used for deciding the logic in the data portion of the signal.

The characteristic of a fifth embodiment of the present invention lies in that a level of an input signal is converted into a half in advance, using a voltage dividing circuit. Then, the peak level of a voltage dividing signal, which is at the half level, is used as a threshold level.

Figure 13:
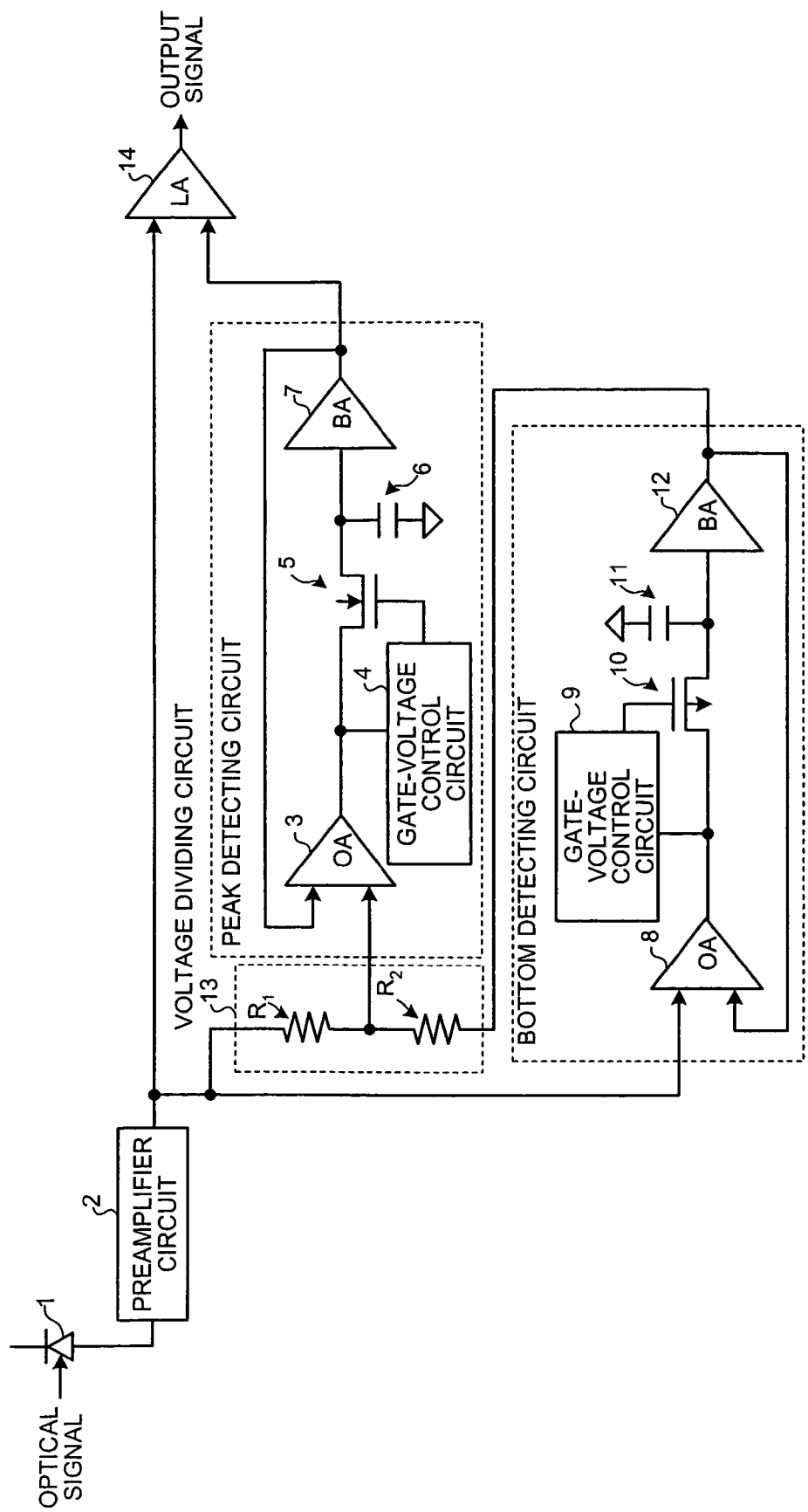
FIG. 13 is a diagram of a principal configuration of an optical receiver according to a fifth embodiment of the present invention.

FIG. 13 is a diagram of a principal configuration of an optical receiver that includes a signal-level detecting apparatus according to the fifth embodiment. In FIG. 13, the constituent elements that are the same as the ones in FIG. 1 are referred to by using the same reference characters, and the explanation thereof will be omitted. The optical receiver shown in FIG. 13 is different from the optical receiver shown in FIG. 1 in that the voltage dividing circuit 13 is provided at a stage prior to a peak detecting circuit and that a level at the center between a voltage signal output from the preamplifier circuit 2 and a bottom level detected by the bottom detecting circuit is supplied to the peak detecting circuit.

According to the fifth embodiment, in the bottom detecting circuit, the bottom level of the voltage signal output from the preamplifier circuit 2 is detected in the same manner as according to the first embodiment, and the detected bottom level is input to the voltage dividing circuit 13. Also, the voltage signal output from the preamplifier circuit 2 is input to the voltage dividing circuit 13. Thus, the voltage dividing circuit 13 supplies a level at the center between the bottom level and the voltage signal (i.e. a voltage dividing signal), to the peak detecting circuit.

Subsequently, the peak detecting circuit detects a peak level of the voltage dividing signal, and the detected peak level is output, as it is, to the LA 14, as a threshold level. If the logic of the voltage signal output from the preamplifier circuit 2 is inverted so that the negative-true logic is applied, it is acceptable to provide the voltage dividing circuit 13 at a stage prior to the bottom detecting circuit, so that the peak detecting circuit and the voltage signal are input to the voltage dividing circuit 13, and the bottom detecting circuit detects the bottom level of the voltage dividing signal, as a threshold level.

Figure 14A:
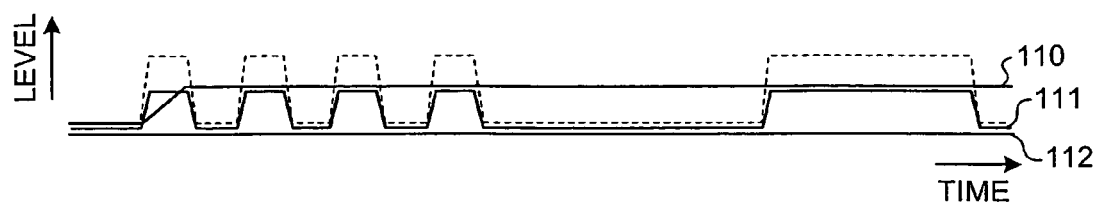
FIG. 14A is drawing of an example of a threshold value controlling operation according to the fifth embodiment.

The operation described above is performed when the preamble portion of the optical signal is received. As shown in FIG. 14A, a bottom level 112 that corresponds to the lowest voltage level in the preamble portion is detected, and a voltage dividing signal 111 of the bottom level 112 and the voltage signal are supplied continuously to the peak detecting circuit. Then, the peak detecting circuit detects a peak level 110 that corresponds to the highest voltage level within the voltage dividing signal 111. In FIG. 14A, the voltage signal is indicated with a broken line.

Figure 14B:
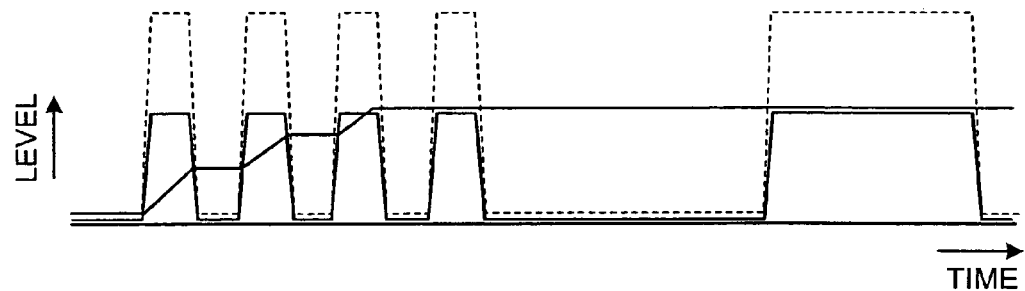
FIG. 14B is a drawing of another example of the threshold value controlling operation according to the fifth embodiment.

The peak level 110 is input to the LA 14 as a threshold level. The LA 14 compares the voltage level of the data portion with the peak level 110 and decides whether the data portion is "1" or "0". Further, even if the average level of the voltage signal is high, because it is not that the gate length of the FET 5 is arranged to be higher, the instantaneous response characteristic is not lost. Consequently, as shown in FIG. 14B, it is possible to detect the peak level accurately within the period of time in which the preamble portion is being received.

In the process described above and the process of deciding the logic in the data portion using the threshold level, the occurrence of the leak current in the FET 5 and the FET 10 is inhibited by the gate-voltage control circuit 4 and the gate-voltage control circuit 9, according to the fifth embodiment as well.

As explained above, according to the fifth embodiment, the level of the input signal is reduced to the half by the voltage dividing process performed in advance so that one of the peak level and the bottom level of the obtained voltage dividing signal is detected and used as a threshold level. Thus, the dynamic range of the signal input to one of the peak detecting circuit and the bottom detecting circuit becomes lower, and it is therefore possible to reduce the cost of the circuit.

The characteristic of a sixth embodiment of the present invention lies in that a logic is decided only based on detection of a peak level, using a differential input signal.

Figure 15:
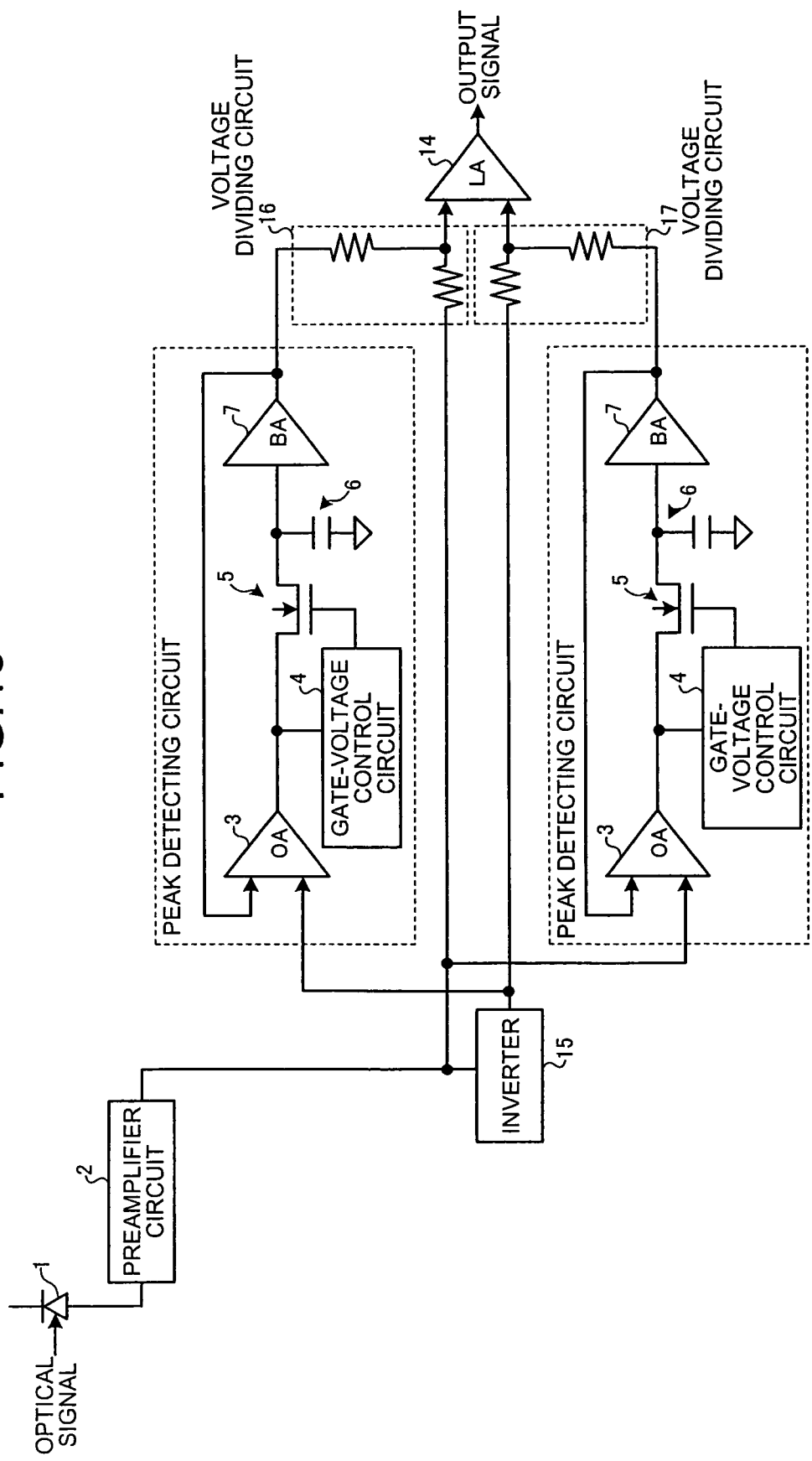
FIG. 15 is a diagram of a principal configuration of an optical receiver according to a sixth embodiment of the present invention.

FIG. 15 is a diagram of a principal configuration of an optical receiver that includes a signal-level detecting apparatus according to the sixth embodiment. In FIG. 15, the constituent elements that are the same as the ones in FIG. 1 are referred to by using the same reference characters, and the explanation thereof will be omitted. The optical receiver shown in FIG. 15 includes the photo diode 1, the preamplifier circuit 2, an inverter 15, two peak detecting circuits, a voltage dividing circuit 16, a voltage dividing circuit 17, and the LA 14.

The inverter 15 performs a differential amplification on a signal output from the preamplifier circuit 2 and outputs an inverted signal that has been obtained to one of the peak detecting circuits and the voltage dividing circuit 17 that is not connected to the output side of the peak detecting circuit.

The voltage dividing circuit 16 outputs, to the LA 14, a level that is at the center between a peak level of the inverted signal detected by the peak detecting circuit and a voltage signal output from the preamplifier circuit 2.

The voltage dividing circuit 17 outputs, to the LA 14, a level that is at the center between a peak level of a voltage signal detected by the peak detecting circuit and the inverted signal output from the inverter 15.

Figure 16A:
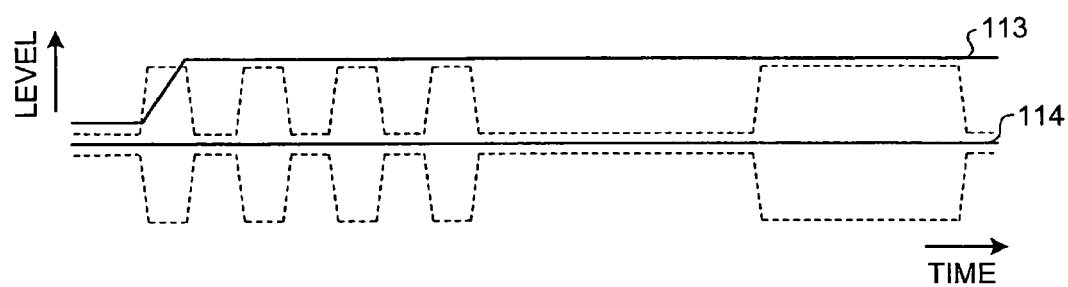
FIG. 16A is a drawing of an example of a peak detection process according to the sixth embodiment.

According to the sixth embodiment, the two peak detecting circuits are provided. A voltage signal is supplied to one of the peak detecting circuits. The inverted signal obtained by inverting the voltage signal is supplied to the other of the peak detecting circuits. Thus, the peak detecting circuit to which the voltage signal is supplied (i.e. the peak detecting circuit shown at the bottom in FIG. 15) detects a peak level 113 as shown in FIG. 16A. On the other hand, the peak detecting circuit to which the inverted signal is supplied (i.e. the peak detecting circuit shown at the top in FIG. 15) detects a peak level 114 as shown in FIG. 16A. In FIG. 16A, the voltage signal and the inverted signal are indicated with broken lines.

Figure 16B:
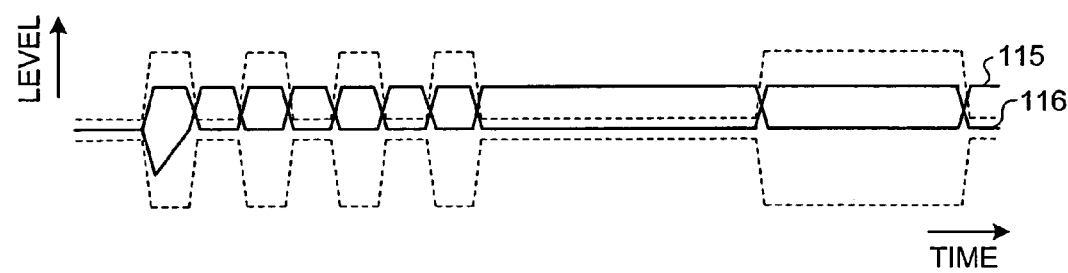
FIG. 16B is a drawing of an example of a voltage dividing signal according to the sixth embodiment.

Further, according to the sixth embodiment, a voltage dividing process is performed by the voltage dividing circuit 17 on the peak level 113 of the voltage signal and the inverted signal. Also, a voltage dividing process is performed by the voltage dividing circuit 16 on the peak level 114 of the inverted signal and the voltage signal. In other words, as shown in FIG. 16B, the voltage dividing circuit 16 obtains, as a voltage dividing signal (hereinafter, "the voltage dividing signal A", a level 116 that is at the center between the peak level 114 and the voltage signal. Also, the voltage dividing circuit 17 obtains, as a voltage dividing signal (hereinafter, "the voltage dividing signal B"), a level 115 that is at the center between the peak level 113 and the inverted signal.

The voltage dividing signal A and the voltage dividing signal B are supplied to the LA 14. The LA 14 decides that the received optical signal is "1", if the voltage dividing signal A is equal to or higher than the voltage dividing signal B. The LA 14 decides that the received optical signal is "0", if the voltage dividing signal A is lower than the voltage dividing signal B.

In the process described above, the occurrence of the leak current in the FET 5 is inhibited by the gate-voltage control circuit 4, according to the sixth embodiment, as well.

As explained above, according to the sixth embodiment, the logic of the input signal is decided using the peak level of the input signal and the peak level of the inverted signal obtained by inverting the input signal. Thus, it is possible to decide the logic of the received optical signal, without having a bottom detecting circuit.

Figure 17:
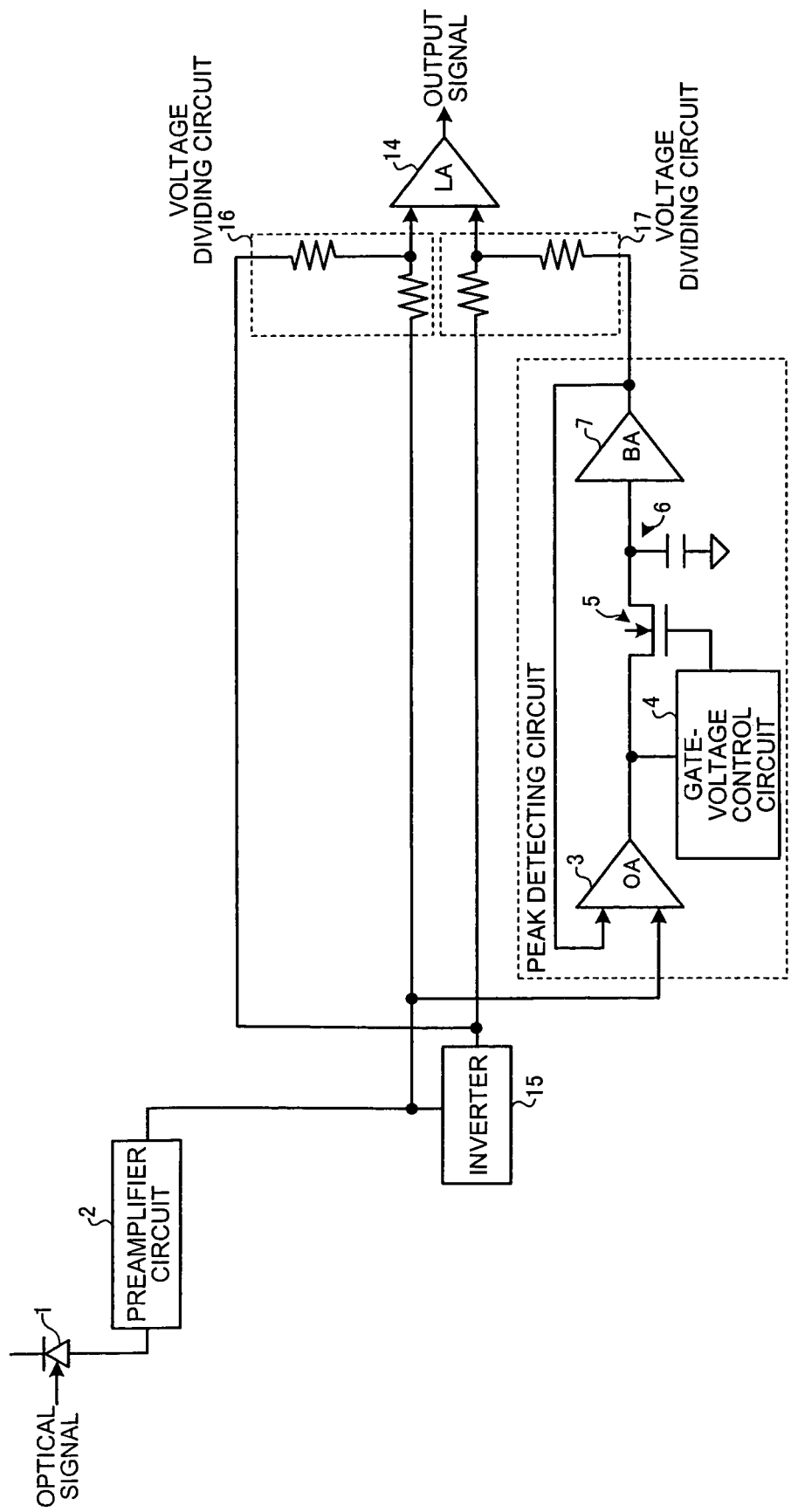
FIG. 17 is a diagram of a principal configuration of another optical receiver according to the sixth embodiment.

According to the sixth embodiment, it is also possible to omit one of the peak detecting circuits. In other words, as shown in FIG. 17, the peak detecting circuit that detects the peak level of the inverted signal may be omitted, so that the voltage dividing circuit 16 performs a voltage dividing process on the voltage signal and the inverted signal. In such a situation, when the resistance value of a resistor element provided within the voltage dividing circuit 16 is adjusted with the ratio of 2 to 1, the voltage dividing signal obtained from the voltage signal and the inverted signal will have a peak in the same section as the voltage signal does.

The characteristic of a seventh embodiment of the present invention lies in that the level of an input signal to be input to one of the peak detecting circuit and the bottom detecting circuit is controlled, and also that a negative bias is applied by simply letting a current flow into a resistor element in the gate-voltage control circuit.

Figure 18:
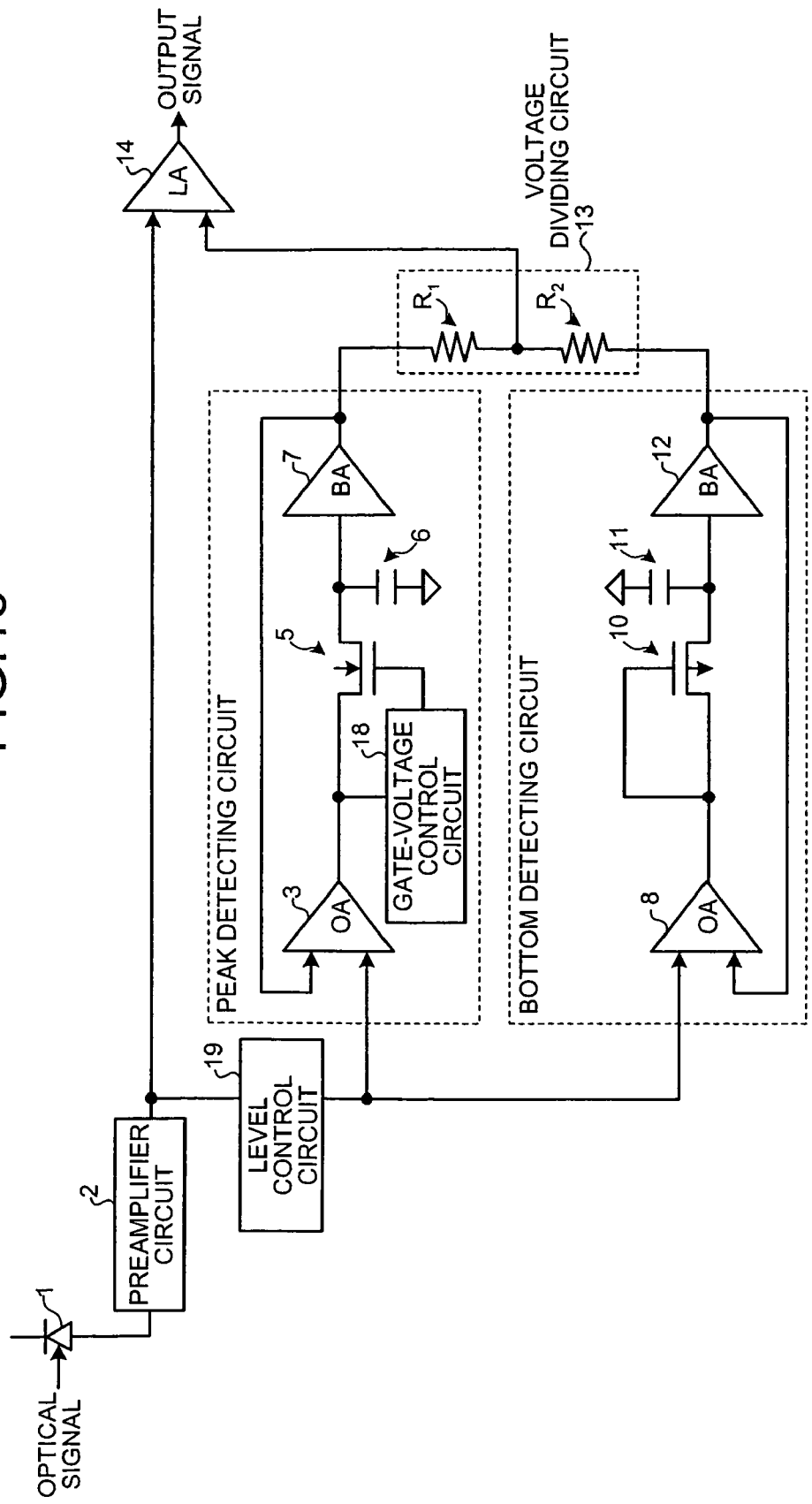
FIG. 18 is a diagram of a principal configuration of an optical receiver according to a seventh embodiment of the present invention.

FIG. 18 is a diagram of a principal configuration of an optical receiver that includes a signal detecting apparatus according to the seventh embodiment. In FIG. 18, the constituent elements that are the same as the ones in FIG. 1 are referred to by using the same reference characters, and the explanation thereof will be omitted. The optical receiver shown in FIG. 18 is configured to include a level control circuit 19 in addition to the optical receiver shown in FIG. 1. The peak detecting circuit shown in FIG. 18 includes a gate-voltage control circuit 18, instead of the gate-voltage control circuit 4 included in the peak detecting circuit shown in FIG. 1. Further, in the bottom detecting circuit shown in FIG. 18, the gate-voltage control circuit 9 included in the bottom detecting circuit shown in FIG. 1 is eliminated.

The gate-voltage control circuit 18 applies a negative bias to a gate voltage that corresponds to the process variations and the environmental conditions of the FET 5 and applies the gate voltage to the FET 5. More specifically, as shown in FIG. 19, the gate-voltage control circuit 18 includes a resistor element 18a. By letting a current flow into the resistor element 18a, the gate-voltage control circuit 18 makes the voltage at the point B in the drawing lower than the voltage at the point A in the drawing (i.e. a applies a negative bias). Then, the gate-voltage control circuit 18 applies the voltage at the point B to the FET 5, as a gate voltage. In this situation, because the resistance value of the resistor element 18a included in the gate-voltage control circuit 18 does not change, the higher the current flowing in the resistor element is, the higher the difference between the voltage at the point A in the drawing and the voltage at the point B in the drawing is.

The level control circuit 19 includes an FET that has substantially the same characteristic as the FET 5. Using a voltage signal output from the preamplifier circuit 2 as a gate voltage, the level control circuit 19 lowers the level of the voltage signal as much as a threshold voltage that corresponds to the process variations and the environmental conditions. Thus, the level control circuit 19 supplies an input signal of which the level varies in correspondence with the process variations and the environmental conditions, to the peak detecting circuit and the bottom detecting circuit. More specifically, when the process has a low threshold voltage, or when the temperature is high, the level control circuit 19 supplies an input signal of which the level is relatively high, because the threshold voltage of the FET included in the level control circuit 19 is low. Conversely, when the process has a high threshold voltage, or when the temperature is low, the level control circuit 19 supplies an input signal of which the level is relatively low, because the threshold voltage of the FET included in the level control circuit 19 is high.

According to the seventh embodiment, the level control circuit 19 controls the level of the input signal itself that is to be input to the peak detecting circuit and the bottom detecting circuit, in correspondence with the process variations and the environmental conditions. In other words, when under a condition where a leak current occurs easily, for example, when the process has a low threshold voltage or when the temperature is high, the input signal is at a higher level, and the voltage at the point A in FIG. 19 is higher. As a result, the current flowing in the resistor element included in the gate-voltage control circuit 18 is higher. Thus, the difference between the voltage at the point B and the voltage at the point A in FIG. 19 is relatively high. It means that the negative bias applied to the gate voltage of the FET 5 is higher. Consequently, the current conducted through the FET 5 is lower, and the occurrence of the leak current is more strictly inhibited.

On the other hand, when under a condition where a leak current does not occur easily, for example, when the process has a high threshold voltage or when the temperature is low, the input signal is at a lower level, and the voltage at the point A in FIG. 19 is lower than the situation described above. As a result, the current flowing in the resistor element included in the gate-voltage control circuit 18 is lower. Thus, the difference between the voltage at the point B and the voltage at the point A in FIG. 19 is relatively low. It means that the negative bias applied to the gate voltage of the FET 5 is lower. Consequently, the current conducted through the FET 5 is higher, and the occurrence of the leak current is less strictly inhibited.

According to the seventh embodiment, the signals that are output from the level control circuit 19 and are at the same level are supplied to both of the peak detecting circuit and the bottom detecting circuit, respectively. Thus, the gate-voltage control circuit is provided only in the detecting circuit in which a leak current occurs easily.

As explained above, according to the seventh embodiment, the level of the input signal that is to be input to the peak detecting circuit and the bottom detecting circuit is controlled, and a negative bias is applied. Thus, it is possible to make the configuration of the gate-voltage control circuit simple.

Further, it is possible to realize the exemplary embodiments of the present invention described above in any combination. In other words, it is acceptable to use the internal configuration of the gate-voltage control circuit according to any one of the first through the third embodiments, as the gate-voltage control circuit according to the fourth through the sixth embodiments.

As described above, according to an embodiment of the present invention, a differential amplification is performed on the highest levels or the lowest levels of the input signal and the previous input signal. The voltage applied to the first terminal in the semiconductor element is controlled based on one of the voltage and the current related to the reference semiconductor element that has substantially the same characteristic as the semiconductor element that transfers the signal level from the second terminal to the third terminal. The signal level obtained as a result of the differential amplification is transferred from the second terminal to the third terminal, using the current that is conducted from the second terminal to the third terminal, in correspondence with the voltage applied to the first terminal. The signal level output by the third terminal is stored. Thus, it is possible to decide whether the condition is such that a leak current occurs easily in the semiconductor element, using the reference semiconductor element. It is also possible to adjust the amount of the conducted current by controlling the gate voltage of the semiconductor element. Thus, it is possible to inhibit the occurrence of the leak current, without losing the instantaneous response characteristic.

Furthermore, according to an embodiment of the present invention, a leak current is generated in the reference semiconductor element, and a current that corresponds to the generated leak current is generated, and also a negative bias is applied to the voltage being applied to the first terminal, using the generated current. Thus, the higher the leak current that may occur in the semiconductor element is, the higher the negative bias is, and also the lower the amount of the current conducted in the semiconductor element is. As a result, it is possible to inhibit the current that corresponds to the leak current in the semiconductor element.

Moreover, according to an embodiment of the present invention, a constant voltage is generated, and a current is generated in the reference semiconductor element in correspondence with the generated voltage, and also a negative bias is applied to the voltage being applied to the first terminal, using the generated current. Thus, it is possible to inhibit the occurrence of the leak current with the simple circuit configuration that includes only the constant bias circuit and the reference semiconductor element.

Furthermore, according to an embodiment of the present invention, the threshold voltage conducted by the reference semiconductor element is detected, and a current that corresponds to the detected threshold voltage is generated in the current source circuit. Then, a current that corresponds to the current generated in the current source circuit is generated, and a negative bias is applied to the voltage being applied to the first terminal, using the generated current. Thus, it is possible to detect the change in the threshold voltage in correspondence with the process variations and the environmental conditions and also to apply the negative bias that is suitable for the threshold voltage. In addition, it is possible to inhibit the occurrence of the leak current with the circuit configuration in which the constant current source that generates the constant current is included.

Moreover, according to an embodiment of the present invention, the signal level of the input signal is lowered using the reference semiconductor element, and a negative bias is applied to the voltage being applied to the first terminal, using the current that flows in the resistor element, in correspondence with the lowered signal level. Thus, it is possible to make the circuit configuration simple for the circuit that controls the voltage being applied to the first terminal.

Furthermore, according to an embodiment of the present invention, the negative bias applied to the voltage being applied to the first terminal is increased or decreased in such a manner that the lower the threshold voltage conducted by the reference semiconductor element is, the higher the negative bias is, and also the higher the threshold voltage conducted by the reference semiconductor element is, the lower the negative bias is. Accordingly, when the process has a low threshold voltage and a leak current therefore occurs easily in the semiconductor element, the negative bias is increased. Thus, it is possible to apply the negative bias without failure, in correspondence with the leak current that may occur.

Moreover, according to an embodiment of the present invention, the negative bias applied to the voltage being applied to the first terminal is increased or decreased in such a manner that the higher the ambient temperature is, the higher the negative bias is, and also the lower the ambient temperature is, the lower the negative bias is. Accordingly, when the temperature is high and a leak current therefore occurs easily in the semiconductor element, the negative bias is increased. Thus, it is possible to apply the negative bias without failure, in correspondence with the leak current that may occur.

Furthermore, according to an embodiment of the present invention, a differential amplification is performed on the input signal and the stored signal level. Thus, only the signal level that is either higher or lower than the signal level that has already been input is passed. Accordingly, it is possible to detect one of the peak level and the bottom level of the input signal without failure.

Moreover, according to an embodiment of the present invention, the signal level being stored is obtained by using the signal level detected by another signal-level detecting apparatus as a reference. Thus, even if the bias applied to the input signal has changed during the course of time, it is possible to detect the bottom level by using the peak level as a reference or to detect the peak level by using the bottom level as a reference. Accordingly, it is possible to obtain the peak level and the bottom level that are purely related to the input signal itself and are accurate.

Furthermore, according to an embodiment of the present invention, the optical signal is received, and a preamplifying process is performed on the received optical signal so that the input signal to be input to the signal-level detecting apparatus is output, and also the logic of the input signal is decided using one or both of the peak level and the bottom level of the input signal that have been detected by the signal-level detecting apparatus. Thus, it is possible to use one or both of the peak level and the bottom level that are accurate and have been detected while the leak current is inhibited. Accordingly, it is possible to decide the logic of the input signal accurately.

Moreover, according to an embodiment of the present invention, the peak level and the bottom level of the input signal are detected, the voltage dividing level of the peak level and the bottom level that have been detected is generated, and also the logic of the input signal is decided, using the generated voltage dividing level as a threshold value. Thus, when the input signal is equal to or higher than the threshold value, the logic is decided to be "1". When the input signal is lower than the threshold value, the logic is decided to be "0". Accordingly, even if the optical signal has a signal level that varies so highly during the course of time, it is possible to decide the logic instantly.

Furthermore, according to an embodiment of the present invention, one of the bottom level and the peak level of the input signal is detected, and the voltage dividing level of the one of the bottom level and the peak level that has been detected and the signal level of the input signal is generated. Also, one of the peak level and the bottom level of the generated voltage dividing level is detected, and the logic of the input signal is decided using the one of the peak level and the bottom level that has been detected as a threshold value. Thus, the dynamic range of the signal input to the circuit that detects the one of the peak level and the bottom level that is used as the threshold value becomes lower. Accordingly, it is possible to reduce the cost of the circuit.

Moreover, according to an embodiment of the present invention, one of the peak level and the bottom level of the input signal is detected, and the voltage dividing level of the one of the peak level and the bottom level that has been detected and the inverted signal obtained by inverting the input signal is generated. Also, the voltage dividing level of the inverted signal and the input signal is generated, and the logic of the input signal is decided by comparing the generated voltage dividing levels. Thus, it is possible to decide the logic by detecting only one of the peak level and the bottom level. Accordingly, it is possible to make the circuit configuration simple.

Furthermore, according to an embodiment of the present invention, one of the peak level and the bottom level of the inverted signal is detected, and the voltage dividing level of the one of the peak level and the bottom level that has been detected and the input signal is generated. Thus, it is possible to decide the logic by detecting only one of the peak level and the bottom level. Accordingly, it is possible to make the circuit configuration simple.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A signal-level detecting apparatus that detects either one of a peak level and a bottom level of an input signal, the signal-level detecting apparatus comprising:
    an amplifying unit that performs a differential amplification with either one of a previous peak level and a previous bottom level of the input signal and a current input signal;
    a semiconductor element that includes a first terminal, a second terminal, and a third terminal, the semiconductor element transferring a signal level output from the amplifying unit from the second terminal to the third terminal by using a current that is conducted from the second terminal to the third terminal in response to a voltage applied to the first terminal;

a control unit that includes:
  a reference semiconductor element that has a substantially same characteristic as the semiconductor element and conducts a first variable current according to a threshold voltage varying with an environmental condition, and
  a resistor element that is connected between the first terminal and the second terminal of the semiconductor element and conducts a second variable current corresponding to the first variable current from the second terminal to the first terminal to apply a negative bias to the voltage applied to the first terminal of the semiconductor element; and
a holding unit that holds a signal level output from the third terminal of the semiconductor element,
wherein the second variable current becomes lower when the threshold voltage becomes higher, while the second variable current becomes higher when the threshold voltage becomes lower.

2. The signal-level detecting apparatus according to claim 1, the control unit comprising:
a leak-current generating circuit that includes the reference semiconductor element and generates a leak current as the first variable current in the reference semiconductor element, and
a current mirror circuit that generates the second variable current corresponding to the leak current generated by the leak-current generating circuit, and
the resistor element applies the negative bias to the voltage applied to the first terminal of the semiconductor element with the second variable current.

3. The signal-level detecting apparatus according to claim 1, wherein
the amplifying unit performs a differential amplification with the current input signal and either one of the previous peak level and the previous bottom level of the input signal held by the holding unit.

4. A signal-level detecting apparatus that detects either one of a peak level and a bottom level of an input signal, the signal-level detecting apparatus comprising:
an amplifying unit that performs a differential amplification with either one of a previous peak level and a previous bottom level of the input signal and a current input signal;
a semiconductor element that includes a first terminal, a second terminal, and a third terminal, the semiconductor element transferring a signal level output from the amplifying unit from the second terminal to the third terminal by using a current that is conducted from the second terminal to the third terminal in response to a voltage applied to the first terminal;
a control unit that includes;
  a reference semiconductor element having a substantially same characteristic as the semiconductor element and conducting a first variable current according to a threshold voltage varying with an environmental condition, and
  a resistor element connected between the first terminal and the second terminal of the semiconductor element and conducting a second variable current corresponding to the first variable current from the second terminal to the first terminal to apply a negative bias to the voltage applied to the first terminal of the semiconductor element; and
a holding unit that holds a signal level output from the third terminal of the semiconductor element,
wherein the control unit increases the negative bias applied to the voltage applied to the first terminal of the semiconductor element as the threshold voltage conducted by the reference semiconductor element is low, and decreases the negative bias as the threshold voltage is high.

5. A signal-level detecting apparatus that detects either one of a peak level and a bottom level of an input signal, the signal-level detecting apparatus comprising:
an amplifying unit that performs a differential amplification with either one of a previous peak level and a previous bottom level of the input signal and a current input signal;
a semiconductor element that includes a first terminal, a second terminal, and a third terminal, the semiconductor element transferring a signal level output from the amplifying unit from the second terminal to the third terminal by using a current that is conducted from the second terminal to the third terminal in response to a voltage applied to the first terminal;
a control unit that includes:
  a reference semiconductor element having a substantially same characteristic as the semiconductor element and conducting a variable current according to a threshold voltage varying with an environmental condition, and
  a resistor element connected between the first terminal and the second terminal of the semiconductor element and conducting a second variable current corresponding to the first variable current from the second terminal to the first terminal to apply a negative bias to the voltage applied to the first terminal of the semiconductor element; and
a holding unit that holds a signal level output from the third terminal of the semiconductor element,
wherein the control unit increases the negative bias applied to the voltage applied to the first terminal of the semiconductor element an ambient temperature is high, and decreases the negative bias as the ambient temperature is low.

6. A signal-level detecting apparatus that detects either one of a peak level and a bottom level of an input signal, the signal-level detecting apparatus comprising:
a differential amplifier that performs a differential amplification with either one of a previous peak level and a previous bottom level of the input signal and a current input signal;
a transistor element that transfers a voltage level output from the differential amplifier by using a current that is conducted in response to a gate voltage;
a control circuit that includes:
  a reference transistor element that has a substantially same characteristics as the semiconductor element and conductors a first variable current according to a threshold voltage varying with an environmental condition, and
  a resistor element that is connected between two terminals of the transistor element and conducts a second variable current corresponding to the first variable current to a gate terminal of the transistor element to apply a negative bias to the gate voltage; and
a capacitor that is charged by the voltage level transferred by the transistor element, wherein the second variable current becomes lower when the threshold voltage becomes higher, while the second variable current becomes higher when the threshold voltage becomes lower.

7. An optical receiver comprising:
a signal-level detecting apparatus that detects either one of a peak level and a bottom level of an input signal, the signal-level detecting apparatus including:
   an amplifying unit that performs a differential amplification with either one of a previous peak level and a previous bottom level of the input signal and a current input signal;
   a semiconductor element that includes a first terminal, a second terminal, and a third terminal, the semiconductor element transferring a signal level output from the amplifying unit from the second terminal to the third terminal by using a current that is conducted from the second terminal to the third terminal in response to a voltage applied to the first terminal;
   a control unit that includes:
      a reference semiconductor element having a substantially same characteristic as the semiconductor element and conducting a first variable current according to a threshold voltage varying with an environmental condition, and
      a resistor element that is connected between the first terminal and the second terminal of the semiconductor element and conducts a second variable current corresponding to the first variable current from the second terminal to the first terminal to apply a negative bias to the voltage applied to the first terminal of the semiconductor element; and
   a holding unit that holds a signal level output from the third terminal of the semiconductor element;
a receiving unit that receives an optical signal;
a preamplifier unit that preamplifies the optical signal received by the receiving unit and outputs the input signal to the signal-level detecting apparatus; and
a comparing unit that compares the current input signal with at least one of the peak level and the bottom level of the input signal detected by the signal-level detecting apparatus,
wherein the second variable current becomes lower when the threshold voltage becomes higher, while the second variable current becomes higher when the threshold voltage becomes lower.

8. The optical receiver according to claim 7, wherein
the signal-level detecting apparatus detects both of the peak level and the bottom level of the input signal, and
the comparing unit includes:
   a generating unit that generates a voltage dividing level of the peak level and the bottom level detected by the signal-level detecting apparatus, and
the comparing unit compares the input signal with the voltage dividing level generated by the generating unit as a threshold value.

9. A signal-level detecting method of detecting either one of a peak level and a bottom level of an input signal by using a semiconductor element including a first terminal, a second terminal, and a third terminal, the signal-level detecting method comprising:

performing a differential amplification with either one of a highest level and a lowest level of the input signal and a previous input signal;
causing a first variable current according to a threshold voltage of a reference semiconductor element varying with an environmental condition to follow in the reference semiconductor element having a substantially same characteristic as the semiconductor element;
applying a negative bias to a voltage applied to the first terminal of the semiconductor element by causing a second variable current corresponding to the first variable current to flow in a resistor element connected between the first terminal and the second terminal of the semiconductor element, the second variable current being conducted from the second terminal to the first terminal;
transferring the signal level output by the differential amplification from the second terminal to the third terminal by using a current that is conducted from the second terminal to the third terminal in response to the voltage applied to the first terminal of the semiconductor element; and
holding a signal level output from the third terminal of the semiconductor element,
wherein the second variable current is lower as the threshold voltage is higher, while the second variable current is higher as the threshold voltage is lower.

10. A signal-level detecting apparatus, comprising a semiconductor element and a control unit that includes:
a reference semiconductor element having a substantially same characteristic as the semiconductor element and conducting a variable current according to a threshold voltage varying with an environmental condition; and
a resistor element that is connected between a first terminal and a second terminal of the semiconductor element and conducts a second variable current corresponding to the first variable current from the second terminal to the first terminal to apply a negative bias to the voltage applied to the second terminal of the semiconductor element,
wherein the second variable current is lower as the threshold voltage is higher, while the second variable current is higher as the threshold voltage is lower.

11. A control unit comprising:
a first semiconductor element that has a substantially same characteristic as a second semiconductor element and conducts a first variable current according to a threshold voltage varying with an environmental condition; and
a resistor element that is connected between a first terminal and a second terminal of the second semiconductor element and conducts a first variable current corresponding to the second variable current from the second terminal to the first terminal to apply a negative bias to a voltage applied to the first terminal of the second semiconductor,
wherein the first variable current becomes lower when the threshold voltage becomes higher and becomes higher when the threshold voltage becomes lower.

* * * * *

UNITED STATES PATENT AND TRADEMARK OFFICE
CERTIFICATE OF CORRECTION

PATENT NO. : 7,683,676 B2
APPLICATION NO. : 11/585277
DATED : March 23, 2010
INVENTOR(S) : Satoshi Ide It is certified that error appears in the above-identified patent and that said Letters Patent is hereby corrected as shown below:

Column 21, Line 55, change "includes;" to --includes:--.

Column 22, Line 57, change "conductors" to --conducts--.

Signed and Sealed this

Sixth Day of July, 2010

David J. Kappos
*Director of the United States Patent and Trademark Office*